US012716968B2

(12) United States Patent
Kim et al.

(10) Patent No.: US 12,716,968 B2
(45) **Date of Patent: *Aug. 25, 2026**

(54) APPARATUS AND METHOD FOR ADJUSTING ATTITUDE

(71) Applicant: Hanwha Vision Co., Ltd., Seongnam-si (KR)

(72) Inventors: Chang Yeon Kim, Seongnam-si (KR); Won Joon Kong, Seongnam-si (KR); Kyoung Jae Lee, Seongnam-si (KR)

(73) Assignee: HANWHA VISION CO., LTD., Seongnam-si (KR)

( * ) Notice: Subject to any disclaimer, the term of this patent is extended or adjusted under 35 U.S.C. 154(b) by 218 days.

This patent is subject to a terminal disclaimer.

(21) Appl. No.: 18/638,145

(22) Filed: Apr. 17, 2024

(65) Prior Publication Data

US 2024/0288515 A1 Aug. 29, 2024

Related U.S. Application Data

(63) Continuation of application No. PCT/KR2022/020775, filed on Dec. 20, 2022.

(30) Foreign Application Priority Data

Jun. 29, 2022 (KR) ........................ 10-2022-0079903
Sep. 2, 2022 (KR) ........................ 10-2022-0111147

(51) Int. Cl.
*G01R 33/00* (2006.01)
*G01R 33/09* (2006.01)
(Continued)

(52) U.S. Cl.
CPC ......... *G01R 33/09* (2013.01); *G01R 33/0017* (2013.01); *H02K 7/14* (2013.01); *H02K 11/215* (2016.01)

(58) Field of Classification Search
CPC ............................ G01R 33/09; G01R 33/0017
See application file for complete search history.

(56) References Cited

U.S. PATENT DOCUMENTS

2002/0124663 A1 9/2002 Tokumoto et al.
2015/0022198 A1 1/2015 David et al.
(Continued)

FOREIGN PATENT DOCUMENTS

KR 10-2085015 B1 3/2020
KR 10-2020-0049054 A 5/2020

OTHER PUBLICATIONS

International Search Report (PCT/ISA/210) dated Mar. 23, 2023, issued by International Searching Authority for International Application No. PCT/KR2022/020775.
(Continued)

*Primary Examiner* — Alesa Allgood
(74) *Attorney, Agent, or Firm* — Sughrue Mion, PLLC

(57) ABSTRACT

An attitude adjustment apparatus includes a driving device comprising a motor configured to generate a driving force; and a control device comprising at least one processor configured to adjust an attitude of a target object based on a rotation angle of the motor, wherein the driving device further comprises: a sensing assembly configured to generate a magnetic field, sense changes in the magnetic field and output, to the at least one processor, sensing result data based on the changes in the magnetic field; and a target, which is rotated by the driving force of the motor, comprising a plurality of blades configured to alter the magnetic field generated by the sensing assembly, and wherein the at least one processor is further configured to determine the rotation angle of the motor based on a target rotation angle and the sensing result data.

13 Claims, 21 Drawing Sheets

(51) Int. Cl.
*H02K 7/14* (2006.01)
*H02K 11/215* (2016.01)

(56) References Cited

U.S. PATENT DOCUMENTS

2018/0069995 A1 3/2018 Lim et al.
2019/0074751 A1 3/2019 Chen
2019/0242764 A1* 8/2019 Nicholl .............. B62D 15/0215
2021/0372826 A1 12/2021 Nakanishi
2022/0037954 A1 2/2022 Downs et al.
2022/0115932 A1 4/2022 Schmitt et al.
2024/0004274 A1* 1/2024 Kim ....................... G01R 33/07

OTHER PUBLICATIONS

Communication dated May 8, 2026 issued by the European Patent Office in European Patent Application No. 22949578.3.

* cited by examiner

380

APPARATUS AND METHOD FOR ADJUSTING ATTITUDE

CROSS-REFERENCE TO RELATED APPLICATION

This application is a continuation of International Application No. PCT/KR2022/020775, filed on Dec. 20, 2022, which is based on and claims priority to Korean Patent Application No. 10-2022-0079903 filed on Jun. 29, 2022 and Korean Patent Application No. 10-2022-0111147 filed on Sep. 2, 2022 in the Korean Intellectual Property Office, the disclosures of which are incorporated by reference herein in their entireties.

BACKGROUND

1. Field

The disclosure relates to an attitude adjustment apparatus and method. The an attitude adjustment apparatus and method are capable of adjusting the attitude of a target object through feedback control.

2. Description of the Related Art

Cameras can be used for the purpose of monitoring a targeted location. Users can perform surveillance on the targeted location based on the images captured by the cameras.

When a camera is pointing at only one spot, the surveillance area may be limited. Therefore, pan-tilt equipment can be attached to the camera to switch the shooting direction. The pan-tilt equipment can switch the shooting direction either upon the user's request or automatically, and the camera can execute shooting in the switched direction.

A hall sensor may be used to detect the rotation angle of a motor equipped in the pan-tilt equipment. The hall sensor can detect magnetic fields to sense the rotation angle of the motor. The detected rotation angle of the motor by the hall sensor can be referred to for motor rotation control.

Meanwhile, there is an increasing need for precise control over the camera's surveillance area switching. Therefore, there is a demand for an invention that enables more accurate detection of the motor's rotation angle.

SUMMARY

To address the aforementioned problem, provided is an attitude adjustment apparatus and method to adjust the attitude of a target object through feedback control.

According to an aspect of the disclosure, an attitude adjustment apparatus includes a driving device including a motor configured to generate a driving force; and a control device including at least one processor configured to adjust an attitude of a target object based on a rotation angle of the motor, wherein the driving device further includes: a sensing assembly configured to generate a magnetic field, sense changes in the magnetic field and output, to the at least one processor, sensing result data based on the changes in the magnetic field; and a target, which is rotated by the driving force of the motor, including a plurality of blades configured to alter the magnetic field generated by the sensing assembly, and wherein the at least one processor is further configured to determine the rotation angle of the motor based on a target rotation angle and the sensing result data.

The sensing assembly may further include a coil which may be configured to generate the magnetic field, and a magnetic field sensor which may be configured to sense the magnetic field altered by the plurality of blades and sequentially output a sensor value calculated for each of the plurality of blades.

The sensor value calculated for each of the plurality of blades may correspond to different partial angle ranges within a rotation angle range of the motor, and the control device may be further configured to determine a partial angle range that corresponds to the target rotation angle, among the partial angle ranges, as a reference angle range for determining the rotation angle of the motor.

The at least one processor may be further configured to calculate a predicted rotation angle of the motor that may correspond to the sensor value output by the magnetic field sensor for each of the partial angle ranges, and determine the predicted rotation angle calculated for the reference angle range, among the partial angle ranges, as the rotation angle of the motor.

The at least one processor may be further configured to receive the target rotation angle of the motor, set a current angle of the motor as an initial angle, and control the motor to rotate by the target rotation angle from the initial angle.

According to another aspect of the disclosure, an attitude adjustment apparatus includes: a driving device which may include a motor which may be configured to generate a driving force; and a control device which may include at least one processor which may be configured to adjust an attitude of a target object based on a rotation angle of the motor, wherein the driving device may further include: a first sensing assembly which may be configured to generate a first magnetic field, sense changes in the first magnetic field, and output, to the at least one processor, first sensing result data based on the changes in the first magnetic field; a second sensing assembly which may be configured to generate a second magnetic field, sense changes in the second magnetic field, and output, to the at least one processor, second sensing result data based on the changes in the second magnetic field; a first target, which may be rotated by the driving force of the motor, may include a single first blade configured to alter the first magnetic field; and a second target, which may be rotated by the driving force of the motor, may include a plurality of second blades configured to alter the second magnetic field, and wherein the at least one processor may be further configured to determine the rotation angle of the motor based on a target rotation angle, the first sensing result data, and sensing second result data.

The first sensing assembly may include a first coil which may be configured to generate the first magnetic field, and a first magnetic sensor may include the at least one second processor which may be configured to sense the first magnetic field altered by the first blade and output a first sensor value calculated for the first blade, and the second sensing assembly may include a second coil which may be configured to generate the second magnetic field, and a second magnetic sensor which may include the at least one third processor which may be configured to sense the second magnetic field altered by the plurality of second blades and output a second sensor value calculated for each of the plurality of second blades.

The second sensor value calculated for each of the plurality of second blades may correspond to different partial angle ranges within a rotation angle range of the motor, and the at least one processor may be further configured to determine a partial angle range that may correspond to the first sensor value from the at least one second processor, among the partial angle ranges, as a reference angle range for determining the rotation angle of the motor.

The at least one processor may be further configured to calculate a predicted rotation angle of the motor that may correspond to the second sensor value output by the at least one third processor for each of the partial angle ranges, and determine the predicted rotation angle calculated for the reference angle range, among the partial angle ranges, as the rotation angle of the motor.

The at least one processor may be further configured to receive the target rotation angle of the motor, set a current angle of the motor as an initial angle, and control the motor to rotate by the target rotation angle from the initial angle.

According to another aspect of the disclosure, an attitude adjustment apparatus includes: a driving device which may include a motor which may be configured to generate a driving force; and a control device which may include at least one processor which may be configured to adjust an attitude of a target object based on a rotation angle of the motor, wherein the driving device may further include: a first sensing assembly which may be configured to generate a first magnetic field, sense changes in the first magnetic field, and output, to the at least one processor, first sensing result data based on the changes in the first magnetic field; a second sensing assembly which may be configured to generate a second magnetic field, sense changes in the second magnetic field, and output, to the at least one processor, second sensing result data based on the changes in the second magnetic field; a first target, which may be rotated by the driving force of the motor, which may include a plurality of first blades configured to alter the first magnetic field; and a second target, which may be rotated by the driving force of the motor, which may include a plurality of second blades configured to alter the second magnetic field, and wherein the at least one processor may be further configured to determine the rotation angle of the motor based on a target rotation angle, the first sensing result data, and the second sensing result data.

A difference between the number of blades in the plurality of first blades and the plurality of second blades may be one.

The first sensing assembly may include a first coil which may be configured to generate the first magnetic field, and a first magnetic sensor which may be configured to sense the first magnetic field altered by the plurality of first blades and output a first sensor value calculated for each of the plurality of first blades, the second sensing assembly may include a second coil which may be configured to generate the second magnetic field, and a second magnetic sensor which may be configured to sense the second magnetic field altered by the plurality of second blades and output a second sensor value calculated for each of the plurality of second blades, and the at least one processor may be further configured to determine the rotation angle of the motor based on a combination of the first and second sensor values.

The at least one processor may be further configured to receive a target rotation angle of the motor, set a current angle of the motor as an initial angle, and control the motor to rotate by the target rotation angle from the initial angle.

According to another aspect of the disclosure, an attitude adjustment method may include: receiving, by a control device which may include at least one processor, a control command, for adjusting an attitude of a target object; driving a motor provided in the driving device in response to the control command; determining a rotation angle of the motor; and adjusting the attitude of the target object based on the rotation angle of the motor, wherein the determining a rotation angle of the motor may include: generating a magnetic field, sensing changes in the magnetic field, and outputting, to the at least one processor, sensing result data based on the changes in the magnetic field; and rotating a target by a driving force of the motor and altering the magnetic field, and wherein the determining the rotation angle of the motor may include determining the rotation angle of the motor based on a target rotation angle and the sensing result data.

The generating the magnetic field is by a sensing assembly which may include a coil which may be configured generate the magnetic field, and a magnetic field sensor may be configured to sense the magnetic field altered by the plurality of blades and sequentially output a sensor value calculated for each of the plurality of blades, wherein the sensor value calculated for each of the plurality of blades may correspond to different partial angle ranges within the rotation angle range of the motor, and wherein the determining the rotation angle of the motor, may further include determining, by the at least one processor, a partial angle range that corresponds to the target rotation angle, among the partial angle ranges, as a reference angle range for determining the rotation angle of the motor, calculating, by the at least one first processor, a predicted rotation angle of the motor that corresponds to the sensor value output by the magnetic field sensor for each of the partial angle ranges, and determining, by the at least one processor, the predicted rotation angle calculated for the reference angle range, among the partial angle ranges, as the rotation angle of the motor.

According to another aspect of the disclosure, an attitude adjustment method may include: receiving, by a control device which may include at least one processor, a control command for adjusting an attitude of a target object; driving a motor provided in the driving device in response to the control command; determining a rotation angle of the motor; and adjusting the attitude of the target object based on the rotation angle of the motor, wherein the determining a rotation angle of the motor may include: generating a first magnetic field, sensing changes in the first magnetic field, and outputting, to the at least one processor, first sensing result data based on the changes in the first magnetic field; generating a second magnetic field, sensing changes in the second magnetic field, and outputting, to the at least one processor, second sensing result data based on the changes in the second magnetic field; rotating a first target by a driving force of the motor and altering the first magnetic field; and rotating a second target by the driving force of the motor and altering the second magnetic field, and wherein the determining the rotation angle of the motor, may include determining the rotation angle of the motor based on a target rotation angle, the first sensing result data, and the sensing second result data.

The generating the first magnetic field is by a first sensing assembly which may include a first coil which may be configured to generate the first magnetic field, and a first magnetic sensor which may be configured to sense the first magnetic field altered by a first blade and output a first sensor value calculated for the first blade, the second sensing assembly may further include a second coil which may be configured to generate the second magnetic field, and a second magnetic sensor which may be configured to sense the second magnetic field altered by a plurality of second blades and output a second sensor value calculated for each of the plurality of second blades, the second sensor value calculated for each of the plurality of second blades may correspond to different partial angle ranges within a rotation angle range of the motor, and the determining the rotation angle of the motor, may further include determining, by the at least one processor, a partial angle range that corresponds to the first sensor value among the partial angle ranges, as a reference angle range for determining the rotation angle of the motor, calculating, by the at least one processor, a predicted rotation angle of the motor that corresponds to the second sensor value for each of the partial angle ranges, and determining, by the at least one processor, the predicted rotation angle calculated for the reference angle range, among the partial angle ranges, as the rotation angle of the motor.

According to another aspect of the disclosure, an attitude adjustment method includes: receiving, by a control device which may include at least one processor, a control command, for adjusting an attitude of a target object; driving a motor provided in the driving device in response to the control command; determining a rotation angle of the motor; and adjusting the attitude of the target object based on the rotation angle of the motor, wherein the determining a rotation angle of the motor may include: generating a first magnetic field, sensing changes in the first magnetic field, and outputting, to the at least one processor, first sensing result data based on the changes in the first magnetic field; generating a second magnetic field, sensing changes in the second magnetic field and outputting, to the at least one processor, second sensing result data based on the changes in the second magnetic field; rotating a first target a driving force of the motor and altering the first magnetic field; and rotating a second target by the driving force of the motor and altering the second magnetic field, and wherein the determining the rotation angle of the motor, may include determining the rotation angle of the motor based on a target rotation angle, the first sensing result data, and the sensing second result data.

The generating the first magnetic field may be by a first sensing assembly which may include a first coil which may be configured to generate the first magnetic field, and a first magnetic sensor which may be configured to sense the first magnetic field altered by a plurality of first blades of the first target and output a first sensor value calculated for each of the plurality of first blades, the second sensing assembly may include a second coil which may be configured to generate the second magnetic field, and a second magnetic sensor which may be configured to sense the second magnetic field altered by a plurality of second blades and output a second sensor value calculated for each of the plurality of second blades, and the determining the rotation angle of the motor may further include determining, by the at least one processor, the rotation angle of the motor based on a combination of the first and second sensor values.

The attitude adjustment apparatus and method may have the advantage of enabling attitude adjustment for a target object with relatively less computation by determining the position of blades based on input values for driving motors.

BRIEF DESCRIPTION OF DRAWINGS

The above and other aspects, features, and advantages of certain embodiments of the present disclosure will become more apparent from the following description taken in conjunction with the accompanying drawings, in which.

DETAILED DESCRIPTION

Figure 1:
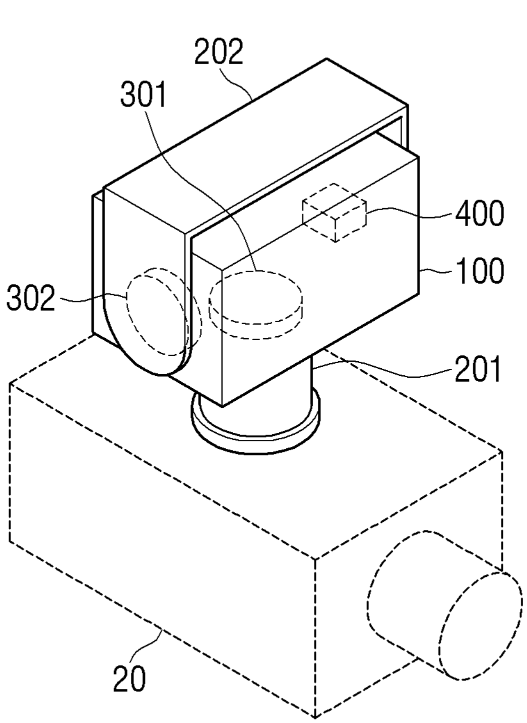
FIG. 1 is a drawing illustrating an attitude adjustment apparatus according to one or more embodiments.

Hereinafter, example embodiments of the disclosure will be described in detail with reference to the accompanying drawings. The same reference numerals are used for the same components in the drawings, and redundant descriptions thereof will be omitted. The embodiments described herein are example embodiments, and thus, the disclosure is not limited thereto and may be realized in various other forms. It is to be understood that singular forms include plural referents unless the context clearly dictates otherwise. The terms including technical or scientific terms used in the disclosure may have the same meanings as generally understood by those skilled in the art.

Unless defined otherwise, all terms used in this specification, including technical and scientific terms, should be interpreted as having meanings that are commonly understood by those skilled in the technical field to which the present invention pertains. Moreover, terms that are defined in commonly used dictionaries should not be construed in an overly idealized or formal sense unless they are explicitly defined otherwise.

Figure 2:
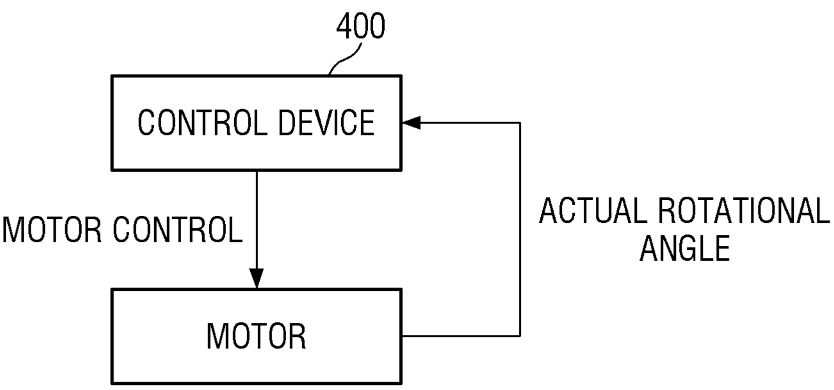
FIG. 2 is a drawing for explaining the operation of a control device according to one or more embodiments.

FIG. 1 is a drawing illustrating an attitude adjustment apparatus according to one or more embodiments. FIG. 2 is a drawing for explaining the operation of a control device according to one or more embodiments.

Referring to FIG. 1, an attitude adjustment apparatus 10 according to one or more embodiments may include a main body 100, rotating bodies 201 and 202, driving devices 301 and 302, and a control device 400.

The main body 100 and the rotating bodies 201 and 202 can be coupled to allow rotation with respect to each other. The attitude adjustment apparatus 10 may include one or more rotating bodies 201 and 202. The one or more rotating bodies 201 and 202 will hereinafter be described as including a first rotating body 201 and a second rotating body 202.

The first rotating body 201 and the second rotating body 202 may rotate individually with respect to the main body 100. Attitudes of the first rotating body 201 and second rotating body and 202 with respect to the main body 100 may be determined individually.

The first rotating body 201 may be coupled to a target object 20, and the second rotating body 202 may be coupled to a reference object such as a wall, but is not limited thereto. An attitude of the target object 20 with respect to the reference object may be determined by attitudes of the first rotating body 201 and the second rotating body 202 with respect to the main body 100. The target object 20 may include a camera. A shooting direction of the camera may be determined by an attitude of the camera with respect to the reference object.

The driving devices 301 and 302 may each generate a driving force for each of the first rotating body 201 and the second rotating body with respect to the main body 100. According to one or more embodiments, the driving devices 301 and 302 may include respective motors to generate driving forces. The driving devices 301 and 302 may be provided in the main body 100, but in one or more embodiments, the driving devices 301 and 302 may each be provided in the first rotating body 201 and the second rotating body 202, respectively. The driving devices 301 and 302 will hereinafter be described as being provided in the main body 100.

The driving devices 301 and 302 may include also be referred to as a first driving device 301 and a second driving device 302, respectively, herein. The first driving device 301 may rotate the first rotating body 201 with respect to the main body 100, and the second driving device 302 may rotate the second rotating body 202 with respect to the main body 100. In a case where the target object 20 is a camera, the first driving device 301 may perform pan control of the camera, and the second driving device 302 may perform tilt control of the camera.

The control device 400 may adjust the attitude of the target object 20. According to one or more embodiments, the control device 400 may adjust the attitude of the target object 20 based on a rotation angle of a motor provided in each of the first driving device 301 and the second driving devices 302. According to one or more embodiments, the control device 400 may receive a control command to direct the target object 20, which is a camera, toward a particular direction. In response to the control command, the control device 400 may drive the motors provided in the first driving device 301 and the second driving devices 302. The attitude of the target object 20 may be adjusted by rotating the first rotating body 201 and second rotating bodies 202 with respect to the main body 100 due to the driving forces from the motors.

Meanwhile, if a discrepancy occurs between the control from the control device 400 and an operation of the motors, an error (hereinafter referred to as attitude error) may exist between a target attitude and an actual attitude of the target object 20. The attitude error of the target object 20 may be identified based on a rotation angle of each of the motors. Referring to FIG. 2, the control device 400 may control at least one of the motors to rotate by a target rotation angle. The control device 400 may also identify an actual rotation angle of the at least one the motors. If there is a difference between the target rotation angle and the actual rotation angle of the at least one of the motors, an attitude error may occur. In this case, the control device 400 may re-control the at least one of the motors so that the attitude error may be corrected. Such feedback control by the control device 400 enables fine attitude adjustment of the target object 20.

When determining the rotation angles of each of the motors, the control device 400 may refer to the target rotation angles and sensing result data from a sensing assembly. This will be described later with reference to FIGS. 13, 14, and 15.

The control device 400 may set current angles of the motors provided in the first driving devices 301 and second driving device 302 as initial angles, and control the motors to rotate by the target rotation angles from the initial angles. As will be described later, the rotation angles of the motors may be identified using a magnetic field sensor 363 (see FIG. 8). The magnetic field sensor 363 offers high-resolution result data compared to a conventional photo interrupter (PI) sensor. The magnetic field sensor 363 may also store particular rotation angles of each of the motors as preset angles, and may detect rotation angles of each of the motors with relatively high accuracy even if the motors slip. In addition, the magnetic field sensor 363 has an advantage of being cheaper than a conventional magnet sensor and being less affected by external influences such as magnetic fields. The control device 400 that controls the motors based on the initial angles will be described later in further detail.

Figure 3:
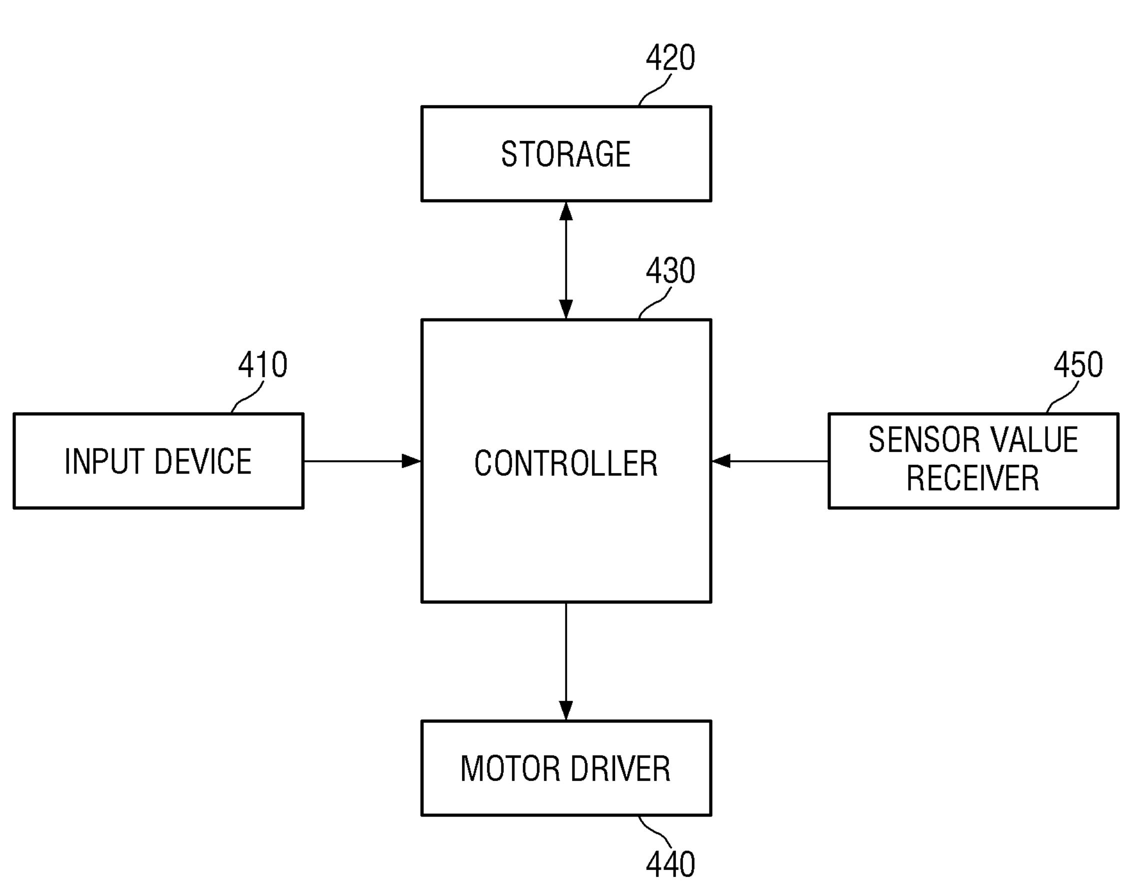
FIG. 3 is a block diagram of the control device according to one or more embodiments.

FIG. 3 is a block diagram of the control device according to one or more embodiments.

Referring to FIG. 3, the control device 400 includes an input device 410, a storage 420, a controller 430, a motor driver 440, and a sensor value receiver 450.

The input device 410 may receive data of the target rotation angles. The motor driver 440 may drive the motors to rotate by the target rotation angles. The motors may rotate according to a driving signal received from the motor driver 440.

The sensor value receiver 450 may receive sensor values for the rotation angles of the motors. As will be described later, the first driving device 301 and the second driving device 302 each include sensors for detecting the rotation angles of the motors, respectively, and the sensor value receiver 450 may receive sensor values from the sensors.

The storage 420 may store a relationship between sensor values and the rotation angles of the motors (hereinafter referred to as the sensor value-rotation angle relationship). According to one or more embodiments, the storage 420 may store the sensor value-rotation angle relationship in the form of a graph shown in FIG. 12.

The controller 430 can determine the actual rotation angles of the motors based on the sensor value-rotation angle relationship. Furthermore, the controller 430 can control the motor driver 440 to compensate for any difference between the target rotation angles and the actual rotation angles. In addition, the controller 430 can perform overall control of the input device 410, the storage 420, the motor driver 440, and the sensor value receiver 450.

Figure 4:
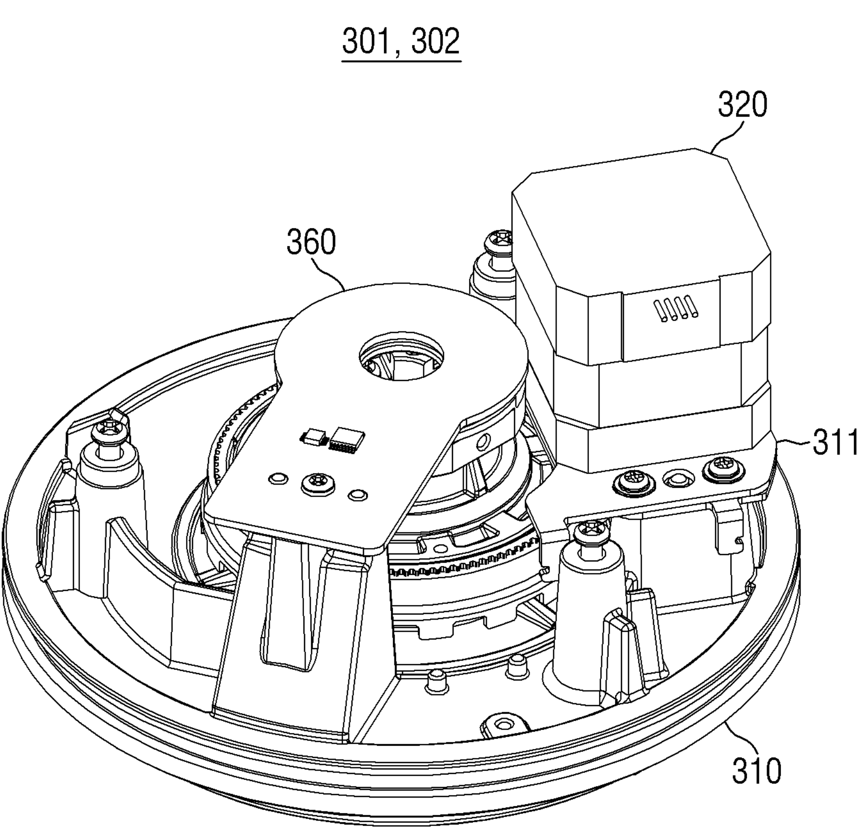
FIG. 4 is a perspective view of a driving device according to one or more embodiments.
Figure 5:
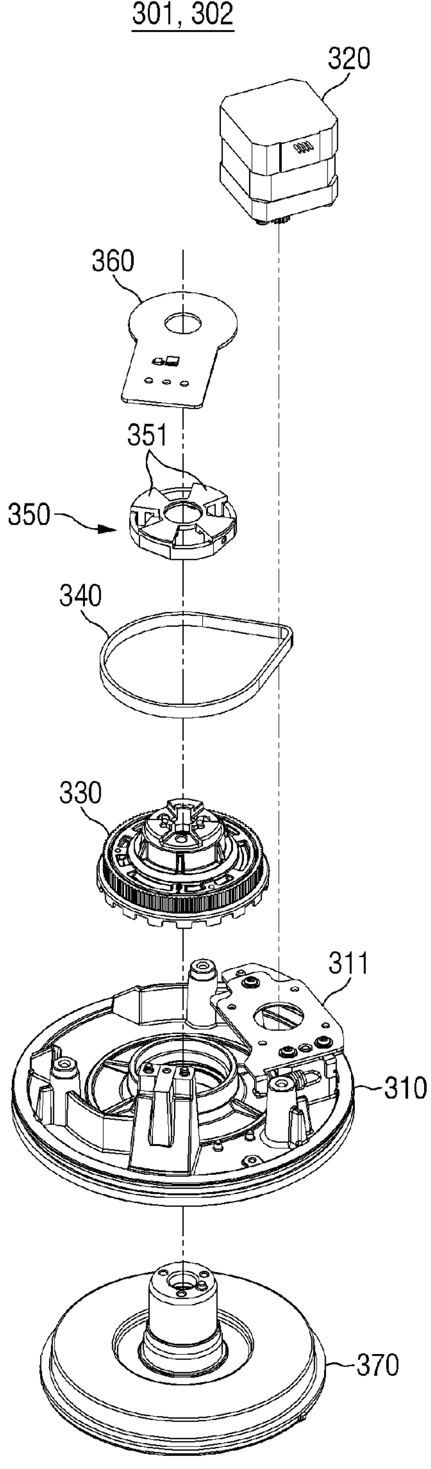
FIG. 5 is an exploded perspective view of the driving device according to one or more embodiments.
Figure 6:
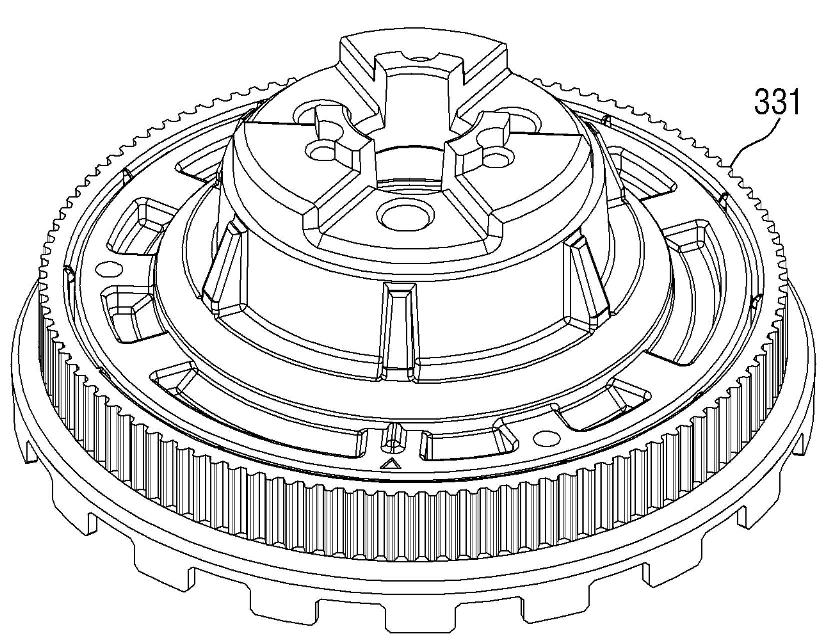
FIG. 6 is a perspective view of a rotor according to one or more embodiments.
Figure 7:
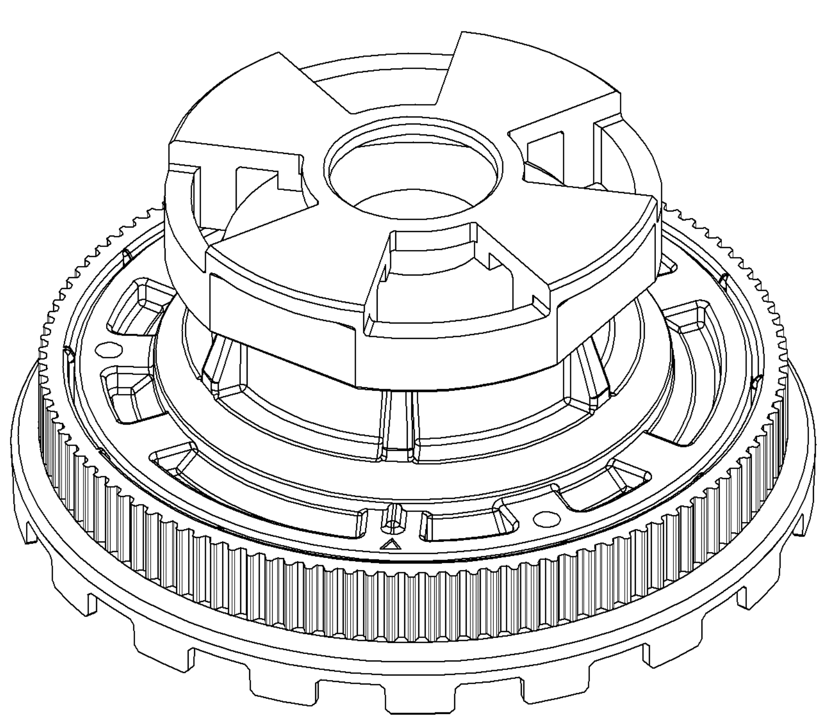
FIG. 7 is a perspective view of the rotor with a target integrated therein according to one or more embodiments.
Figure 8:
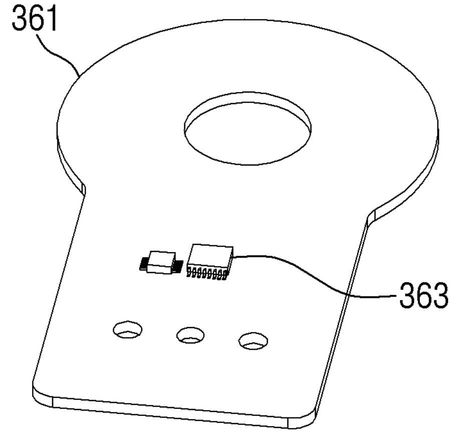
FIG. 8 is a perspective view of a sensing assembly according to one or more embodiments.
Figure 9:
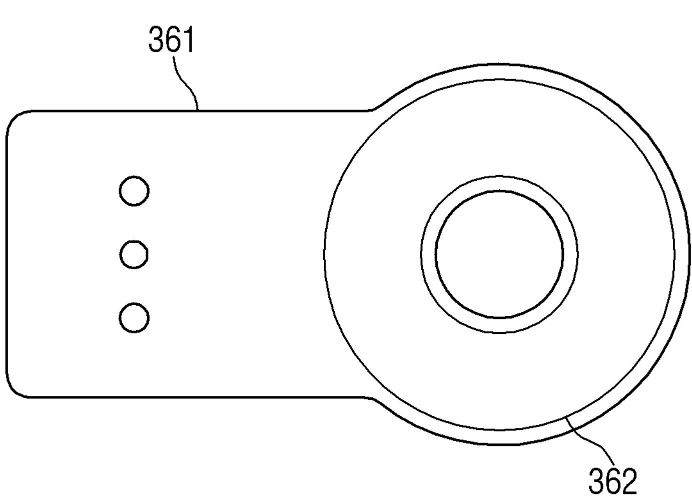
FIG. 9 is a bottom view of the sensing assembly according to one or more embodiments.
Figure 10:
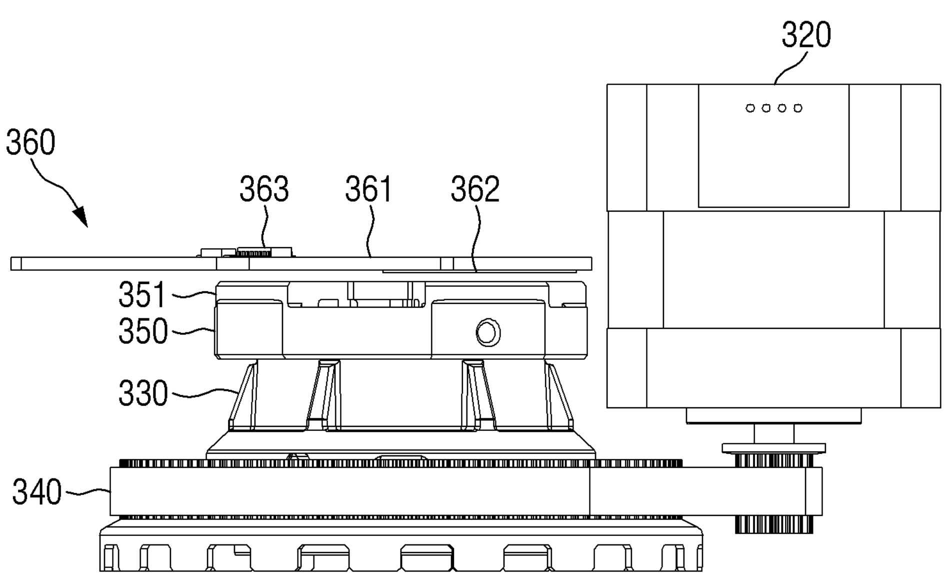
FIG. 10 is a drawing for explaining how the rotation of a motor is detected by the sensing assembly according to one or more embodiments.

FIG. 4 is a perspective view of a driving device according to one or more embodiments, FIG. 5 is an exploded perspective view of the driving device according to one or more embodiments, FIG. 6 is a perspective view of a rotor according to one or more embodiments, FIG. 7 is a perspective view of the rotor with a target integrated therein according to one or more embodiments, FIG. 8 is a perspective view of a sensing assembly according to one or more embodiments, FIG. 9 is a bottom view of the sensing assembly according to one or more embodiments, and FIG. 10 is a drawing for explaining how the rotation of a motor is detected by the sensing assembly according to one or more embodiments.

Referring to FIGS. 4 and 5, the driving device 301 or 302 is configured to include a base 310, a motor 320, a rotor 330, a power transmitter 340, a target 350, a sensing assembly 360, and a rotator 370.

The base 310 may provide a rotational reference for the rotor 330. The rotor 330 may rotate with respect to the base 310. The base 310 may be fixed to the main body 100. The rotor 330 may rotate with respect to the main body 100 and may provide a driving force to the rotating body 201 or 202.

Furthermore, the base 310 integrates multiple components provided in the driving device 301 or 302. The multiple components of the driving device 301 or 302 may be coupled directly or indirectly to the base 310. According to one or more embodiments, the base 310 may include a motor plate 311 for coupling the motor 320. The integration of the multiple components into a single unit facilitates an operation of the driving device 301 or 302.

The motor 320 may generate a driving force. According to one or more embodiments, the motor 320 may be a stepping motor. Therefore, the motor 320 may rotate by an angle corresponding to an input signal.

The rotor 330 may be rotated by the driving force of the motor 320. The power transmitter 340 may be provided between the motor 320 and the rotor 330. FIG. 5 depicts a belt-type power transmitter 340, but alternatively, in one or more embodiments, the power transmitter 340 may be provided in the form of one or more gears, or wires, not being limited thereto. According to one or more embodiments, the power transmitter 340 may be omitted if the motor 320 and the rotor 330 are directly coupled.

The driving force of the motor 320 may be transmitted to the rotor 330 through the power transmitter 340. As described with reference to FIG. 6, the rotor 330 may include one or more gears 331. The gears 331 of the rotor 330 may be engaged with the power transmitter 340. When the motor 320 rotates, its driving force is transmitted to the rotor 330 through the power transmitter 340, allowing the rotor 330 to rotate along with the motor 320.

According to one or more embodiments, the target 350 and the rotor 330 may be integrally formed. FIG. 7 depicts a rotor 380 as including a target as part of its body. When the target is formed on the rotor 380, the rest of the rotor 380 and the target may be formed of the same material. Alternatively, the rotor 380 and the target may be formed of different materials using a technique such as dual injection molding. The target 350 and the rotor 330 will hereinafter be described as being provided separately.

Returning to FIGS. 4 and 5, the target 350 may be rotated by the driving force of the motor 320. The target 350 may be coupled to the rotor 330. When the rotor 330 rotates due to the driving force of the motor 320, the target 350 may also rotate with the rotor 330. The target 350 may include a plurality of blades 351 (see FIGS. 10 and 11) and may alter a magnetic field generated by the sensing assembly 360. The blades 351 may be formed of a metal material. According to one or more embodiments, the blades 351 may be formed of aluminum. When the blades 351 move through the magnetic field generated by the sensing assembly 360, the magnetic field may be altered.

The sensing assembly 360 may generate a magnetic field and detect changes in the magnetic field. Referring to FIGS. 8 and 9, the sensing assembly 360 is may include a substrate 361, a coil 362, and a magnetic field sensor 363.

The substrate 361 may secure the coil 362 and the magnetic field sensor 363. Moreover, the substrate 361 may supply a current to the coil 362 and power to the magnetic field sensor 363.

The coil 362 may generate a magnetic field. The coil 362 may be arranged on one side of the substrate 361 in the shape of a ring. As the current is applied to the coil 362, a magnetic field may be generated around the coil 362.

Referring to FIGS. 8, 9 and 10, the magnetic field sensor 363 may detect the magnetic field altered by the blades 351 and may output a sensor value accordingly.

The coil 362 may be disposed on one side of the substrate 361 facing the blades 351. The target 350 may rotate along with the rotor 330 due to the driving force of the motor 320. As the target 350 rotates, the blades 351 may move around the coil 362. When the blades 351, which are formed of a metal material, move around the coil 362, the magnetic field may change. The magnetic field sensor 363 may continuously sense the magnetic field around the coil and may output a sensor value, which is the result of the sensing. According to one or more embodiments, the sensor value may represent the magnitude of the magnetic field. The range of sensor values may correspond to the range of rotation angles of the motor 320.

The target 350 may include a plurality of blades 351. Consequently, the magnetic field sensor 363 may detect the magnetic field altered by the blades 351 and may sequentially output a sensor value calculated for each of the blades 351.

Returning to FIGS. 4 and 5, the rotator 370 may output the rotational force of the rotor 330. The rotator 370 may be fixedly coupled to the rotor 330. As the rotor 330 rotates, the rotator 370 may rotate together with the rotor 330. The rotator 370 may be coupled to the rotating body 201 or 202. The rotational force of the rotor 330 may be transmitted to the rotating body 201 or 202 through the rotator 370. The base 310 may be fixed to the main body 100, and the rotator 370 may be rotatably coupled to the base 310. Ultimately, the rotating body 201 or 202 may rotate with respect to the main body 100 due to the driving force of the motor 320.

Figure 11:
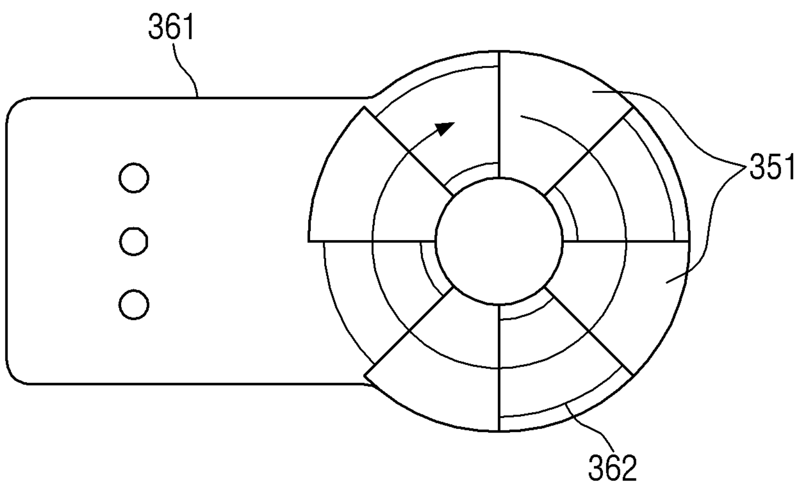
FIG. 11 is a diagram illustrating the rotation of the blades by the sensing assembly according to one or more embodiments.
Figure 12:
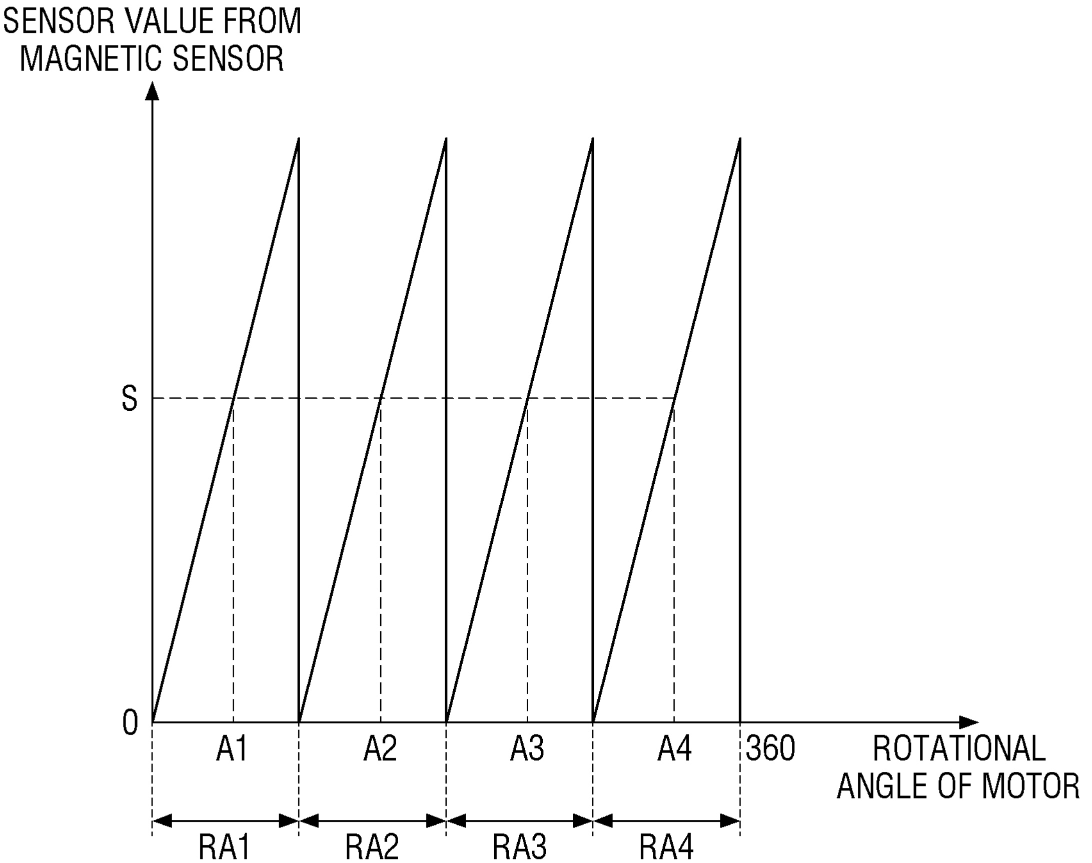
FIG. 12 is a graph showing the relationship between sensor values from the magnetic field sensor and the rotation angles of the motor according to one or more embodiments.

FIG. 11 is a diagram illustrating the rotation of the blades by the sensing assembly according to one or more embodiments, and FIG. 12 is a graph showing the relationship between sensor values from the magnetic field sensor and the rotation angles of the motor according to one or more embodiments.

Referring to FIG. 11, the blades 351 may rotate around a coil 362.

When a current is supplied to the coil 362, a magnetic field may be formed around the coil 362. When the blades 351, which are formed of a metal material, rotate around the coil 143 or 253, the magnetic field may change.

The target 350 may include a plurality of blades 351. Since the blades 351 rotate around the coil 362, the rotation cycle of the motor 320 may include multiple cycles of changes of the magnetic field. Referring to FIG. 12, the rotation cycle of the motor 320, ranging from 0 to 360 degrees, may include multiple cycles of changes of the magnetic field.

The number of cycles of changes of the magnetic field included in the rotation cycle of the motor 320 may correspond to the number of blades 351. According to one or more embodiments, if there are four blades 351 included in the target 350, four cycles of changes of the magnetic field may be generated during one rotation of the motor 320.

Since the rotation cycle of the motor 320 includes multiple cycles of changes of the magnetic field, the rotation angle of the motor 320 cannot be determined solely based on a sensor value from the magnetic field sensor 363. Referring to FIG. 12, a sensor value calculated for each of the blades 351 may correspond to different partial rotation angle ranges RA1 through RA4 within the rotation angle range of the motor 320. According to one or more embodiments, if a sensor value S is detected by the magnetic field sensor 363, the rotation angle of the motor 320 may be one of predicted rotation angles A1 through A4. The predicted rotation angles A1 through A4 represent the rotation angles of the motor 320 within each of the partial rotation angle ranges RA1 through RA4 for a single sensor value.

The magnetic field may be changed by one of the blades 351, outputting a sensor value. To determine the rotation angle of the motor 320, a determination needs to be made as to which of the blades 351 has caused the change in the magnetic field that has resulted in the output sensor value. The blade 351 that has caused the change in the magnetic field will hereinafter be referred to as a reference blade. Once the reference blade is identified, a predicted rotation angle in one of partial angle ranges RA1 through RA4 that corresponds to the reference blade may be determined as the rotation angle of the motor 320.

To identify the reference blade, the blades 351 need to be counted during the rotation of the target 350. Counting the blades 351 requires continuous tracking of the rotation of the target 350, which may necessitate computational resources. The control device 400 of the attitude adjustment apparatus 10 according to one or more embodiments of can identify the reference blade, used to determine the rotation angle of the motor 320, with relatively less computational effort.

Figure 13:
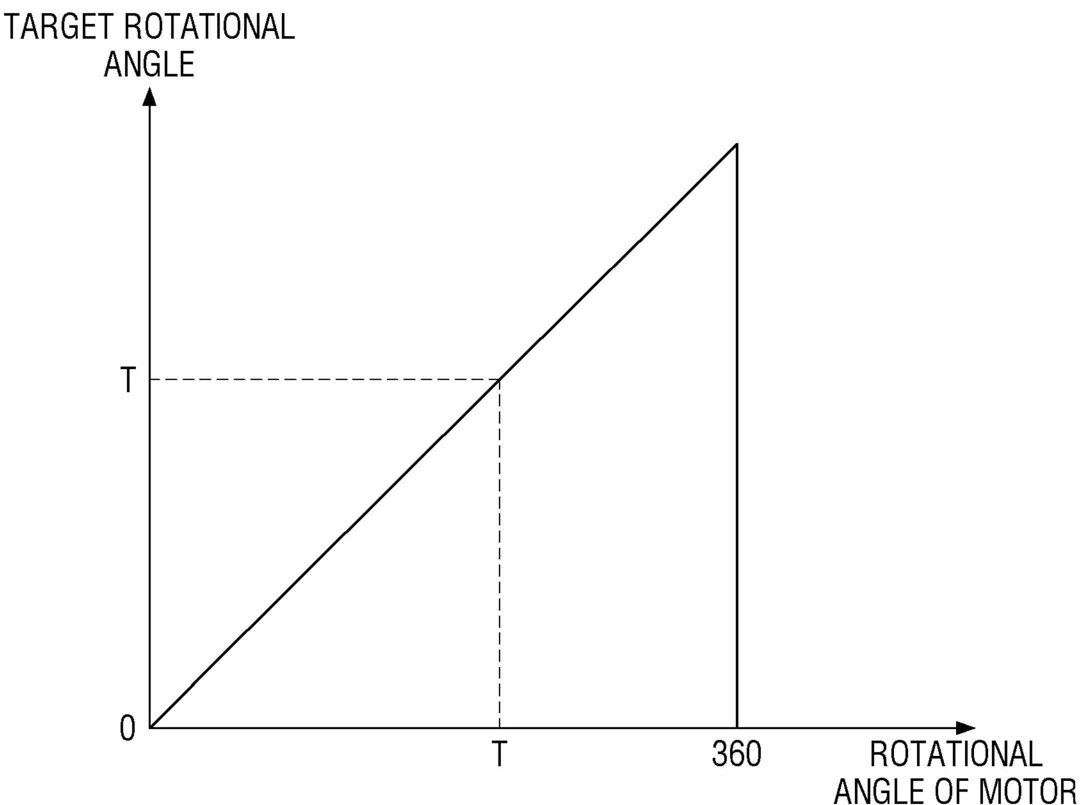
FIG. 13 is a graph showing the rotation angle of the motor for a target rotation angle according to one or more embodiments.
Figure 14:
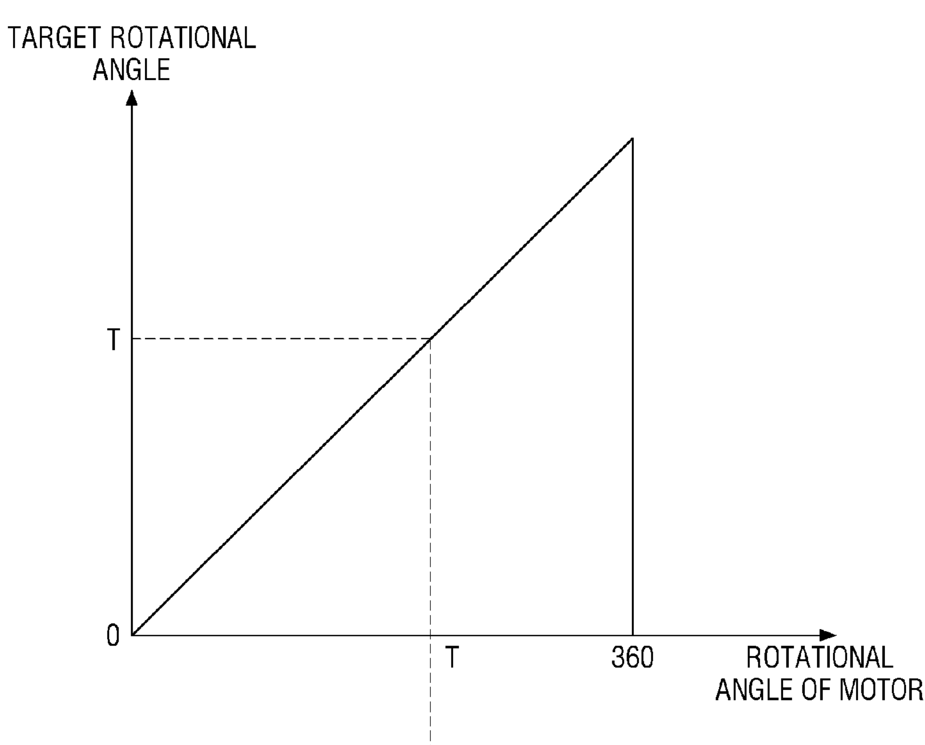
FIG. 14 is a drawing for explaining how to determine a reference angle range based on the target rotation angle according to one or more embodiments.
Figure 14:
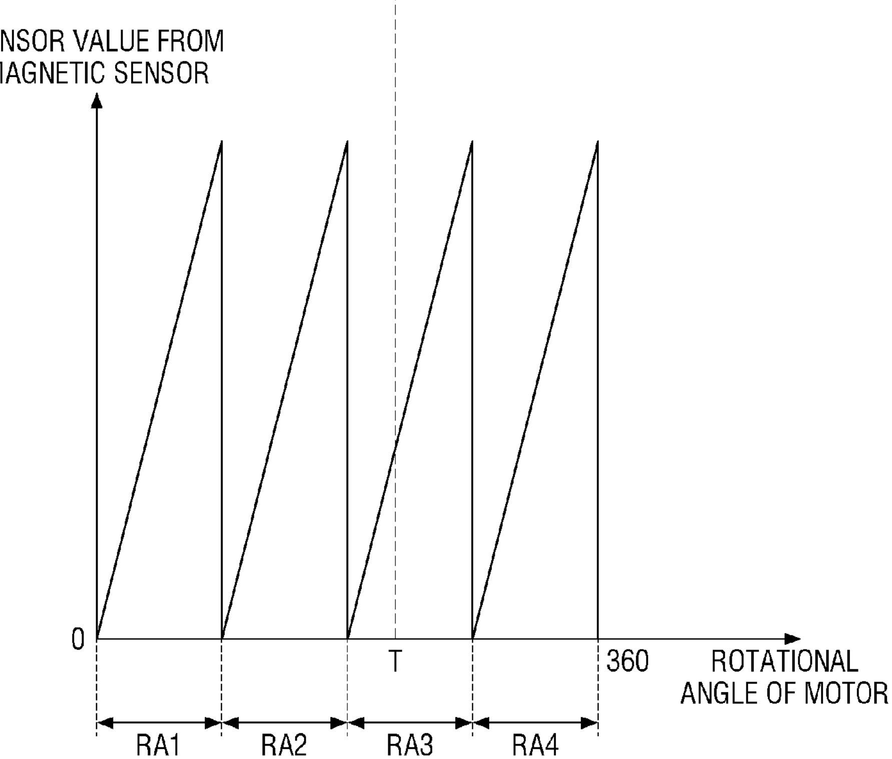
Figure 15:
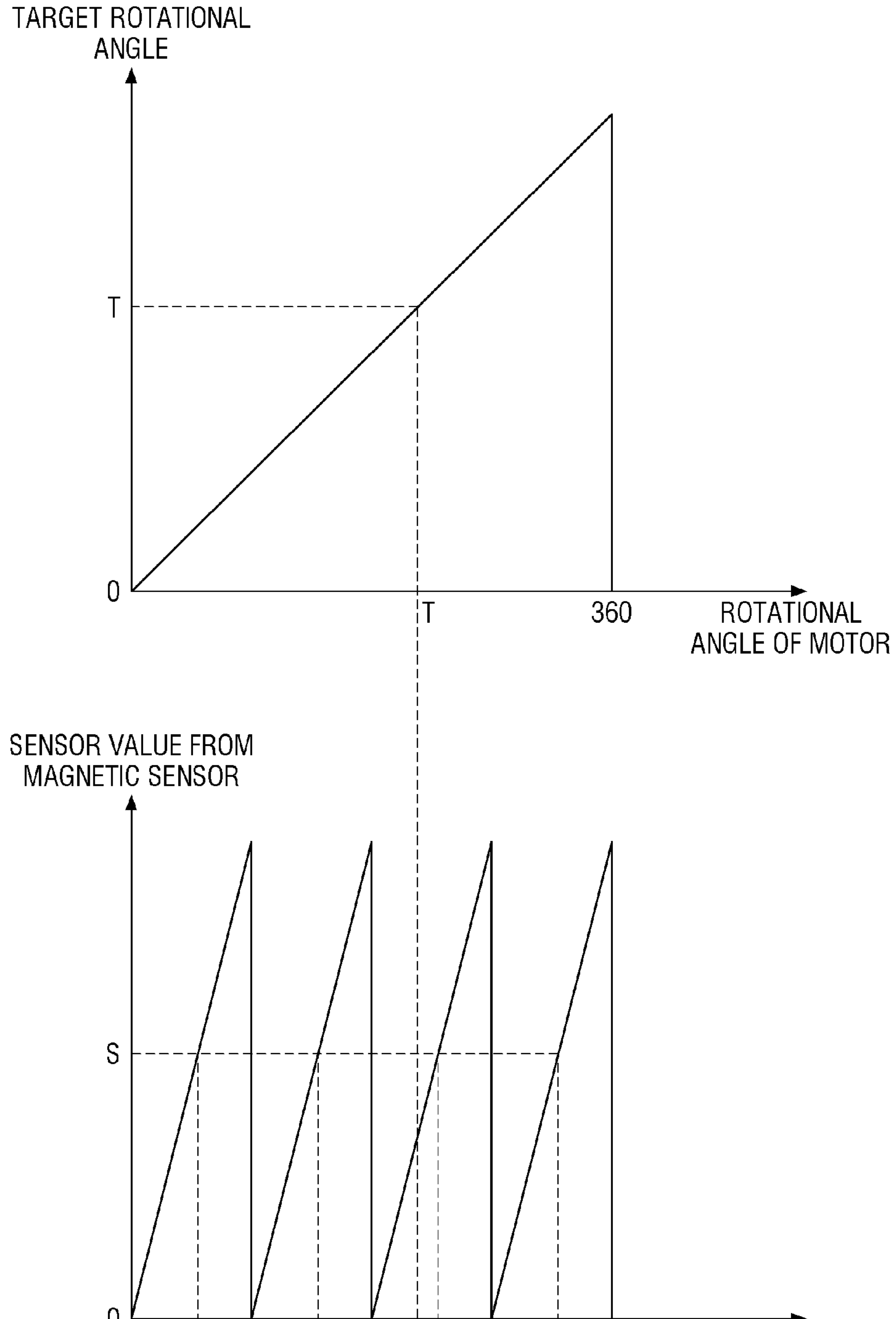
FIG. 15 is a drawing for explaining how to determine the rotation angle of the motor based on a sensor value calculated for the reference angle range according to one or more embodiments.

FIG. 13 is a graph showing the rotation angle of the motor for a target rotation angle according to one or more embodiments, FIG. 14 is a drawing for explaining how to determine a reference angle range based on the target rotation angle according to one or more embodiments, and FIG. 15 is a drawing for explaining how to determine the rotation angle of the motor based on a sensor value calculated for the reference angle range according to one or more embodiments.

Referring to FIG. 13, the target rotation angle may correspond to the actual rotation angle of the motor 320.

When the target rotation angle is input to the input device 410, the motor driver 440 may drive the motor 320 by the target rotation angle. Ideally, if the target rotation angle is T, the actual rotation angle of the motor 320 may also be T. However, various factors may lead to a difference between the target rotation angle and the actual rotation angle.

According to one or more embodiments, the target rotation angle may be used to determine the reference angle range, which is a partial angle range corresponding to the reference blade.

Referring to FIG. 14, the control device 400 may determine one of the partial angle ranges RA1 through RA4 that corresponds to the target rotation angle.

According to one or more embodiments, the reference angle range represents the partial angle range used for determining the rotation angle of the motor 320.

The target rotation angle T may be included in the partial angle range RA3. In this case, the control device 400 may determine the partial angle range RA3, among the partial angle ranges RA1 through RA4, as the reference angle range.

Referring to FIG. 15, the control device 400 may calculate predicted rotation angles of the motor 320 that correspond to the sensor value output by the magnetic field sensor 363 for the respective partial angle ranges RA1 through RA4, and may determine the predicted rotation angle calculated for the reference angle range, among the partial angle ranges RA1 through RA4, as the rotation angle of the motor 320.

If the sensor value output by the magnetic field sensor 363 is S, predicted rotation angles A1, A2, A3, and A4 may be calculated for the partial angle ranges RA1 through RA4, respectively. The partial angle ranges RA1 through RA4 correspond to the blades 351. When counting of the blades 351 is not performed, the control device 400 cannot determine which of the partial angle ranges RA1 through RA4 is the reference angle range. The control device 400 may determine, based on the target rotation angle, that the partial angle range RA3 is the reference angle range and may then determine that the predicted rotation angle A3 is the actual rotation angle of the motor 320 accordingly.

There may be a discrepancy between the target rotation angle T and the actual rotation angle A3. If this discrepancy exceeds a predefined threshold, the control device 400 may re-control the motor 320 to compensate for this discrepancy.

This process will hereinafter be described using a mathematical expression as follows. First, when the number of blades 351 is four, the coordinates of the magnetic field sensor 363 may have four cycles within a designed rotation angle. Based on a full rotation (or 360-degree rotation) of the motor 320, one of the four cycles of the magnetic field sensor 363 may be 90 degrees.

The rotation angle of the motor 320 may be calculated using Equation 1.

$$m-deg = (\text{count of blades}) * (\text{blade angle}) + \left(\frac{e-deg}{\text{number of blades}}\right) \quad \text{[Equation 1]}$$

Here, "m-deg" denotes the rotation angle of the motor 320, and "count of blades" denotes the number of blades 351 corresponding to the reference angle range. The blades 351 may be counted by separate computational means such as a micro-controller unit (MCU). When the number of blades 351 is four, "count of blades" may be determined as a value between 0 and 3.

Additionally, "blade angle" denotes the angle range of the blades 351. Furthermore, "blade angle" may be calculated by Equation 2:

$$\text{blade angle} = \frac{\text{designed rotation angle}}{\text{number of blades}} \quad \text{[Equation 2]}$$

Here, "designed rotation angle" represents the rotation angle range of the motor 320. If the motor 320 is used for a pan operation of a camera, "designed rotation angle" may be 360 degrees, and if the motor 320 is used for a tilt operation of a camera, "designed rotation angle" may be 180 degrees. According to one or more embodiments, if the motor 320 is used for a pan operation and the number of blades 351 is four, then "blade angle" may be 90 degrees (e.g. 90=360/4).

Referring back to Equation 1, "e-deg" denotes the rotation angle of the motor 320 detected by the magnetic field sensor 363. The output value of the magnetic field sensor 363 may include the range from 0 to 2π radians. Also, "number of blades" denotes the number of blades 351.

To calculate the rotation angle of the motor 320 using Equation 1, computational means such as an MCU is required. The use of the computational means may lead to power consumption and may incur manufacturing costs for the installation of the computational means.

The attitude adjustment apparatus according to one or more embodiments may determine the rotation angle of the motor 320 without using computational means such as an MCU.

According to one or more embodiments, if the motor 320 is a stepper motor, a target angle may be input, and based on the target angle, "count of blades" may be calculated as indicated by Equation 3.

$$\text{count of blades} = \text{motor angle}//\text{blade angle} \quad \text{[Equation 3]}$$

Here, "//" represents an operator that yields the quotient when the former number is divided by the latter number. Additionally, "motor angle" corresponds to an input angle for the rotation of the motor 320, which may correspond to the aforementioned target rotation angle. Furthermore, "blade angle" represents the angle range of the blades 351.

By substituting Equation 3 into Equation 1, Equation 4 may be derived.

$$m-deg = (\text{motor angle}//\text{blade angle}) * (\text{blade angle}) + \left(\frac{e-deg}{\text{number of blades}}\right) \quad \text{[Equation 4]}$$

According to one or more embodiments, if the target rotation angle is 240 degrees, the number of blades 351 is four, and the angle detected by the magnetic field sensor 363 is 235 degrees, the rotation angle "m-deg" of the motor 320 may be calculated as 238.75 degrees as follows:

$$m-deg = \left(240//\left(\frac{390}{4}\right)\right) * \left(\frac{360}{4}\right) + \left(\frac{235}{4}\right) = 238.75$$

As mentioned earlier, the target object 20 may include a camera. If the target object 20 is a camera, the target rotation angle may have been input to determine the shooting direction of the camera. To rotate the target object 20 by the target rotation angle, the controller 430 may determine the current angle of the motor 320. The controller 430 sets the current angle of the motor 320 as an initial angle and rotates the target object 20 by the target rotation angle from the initial angle. According to one or more embodiments, if the initial angle is 20 degrees and the target rotation angle is 280 degrees, the controller 430 may rotate the motor 320 by an angle of 260 degrees.

The initial angle may be set without using separate sensing means such as a PI sensor. According to one or more embodiments, the controller 430 may set the initial angle based on the rotation angle of the motor 320 corresponding to the sensor value from the magnetic field sensor 363. As the magnetic field sensor 363 outputs a sensor value with higher resolution compared to a PI sensor, the initial angle set using the sensor value from the magnetic field sensor 363 may provide relatively high accuracy.

According to one or more embodiments, the initial angle may also be the angle of the motor 320 at the time of installation of the target object 20. The controller 430 may control the motor 320 based on the initial angle set at the corresponding time, and this process may be repeated.

Figure 16:
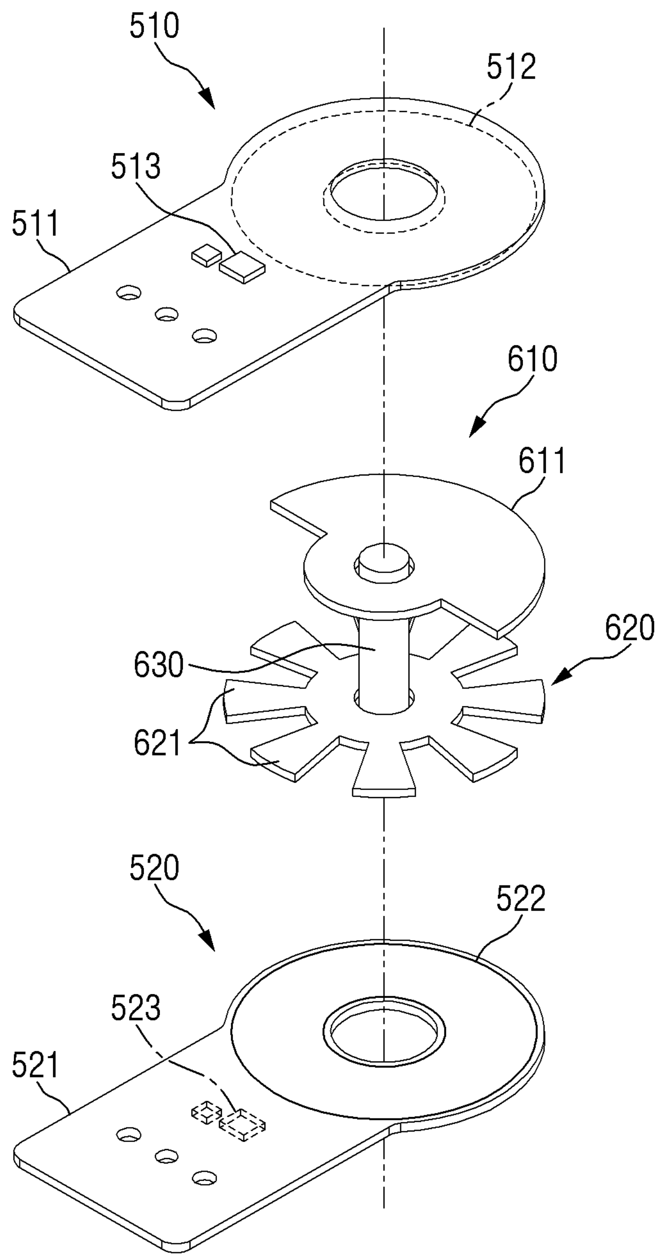
FIG. 16 is a drawing illustrating sensing assemblies and targets according to one or more embodiments.
Figure 17:
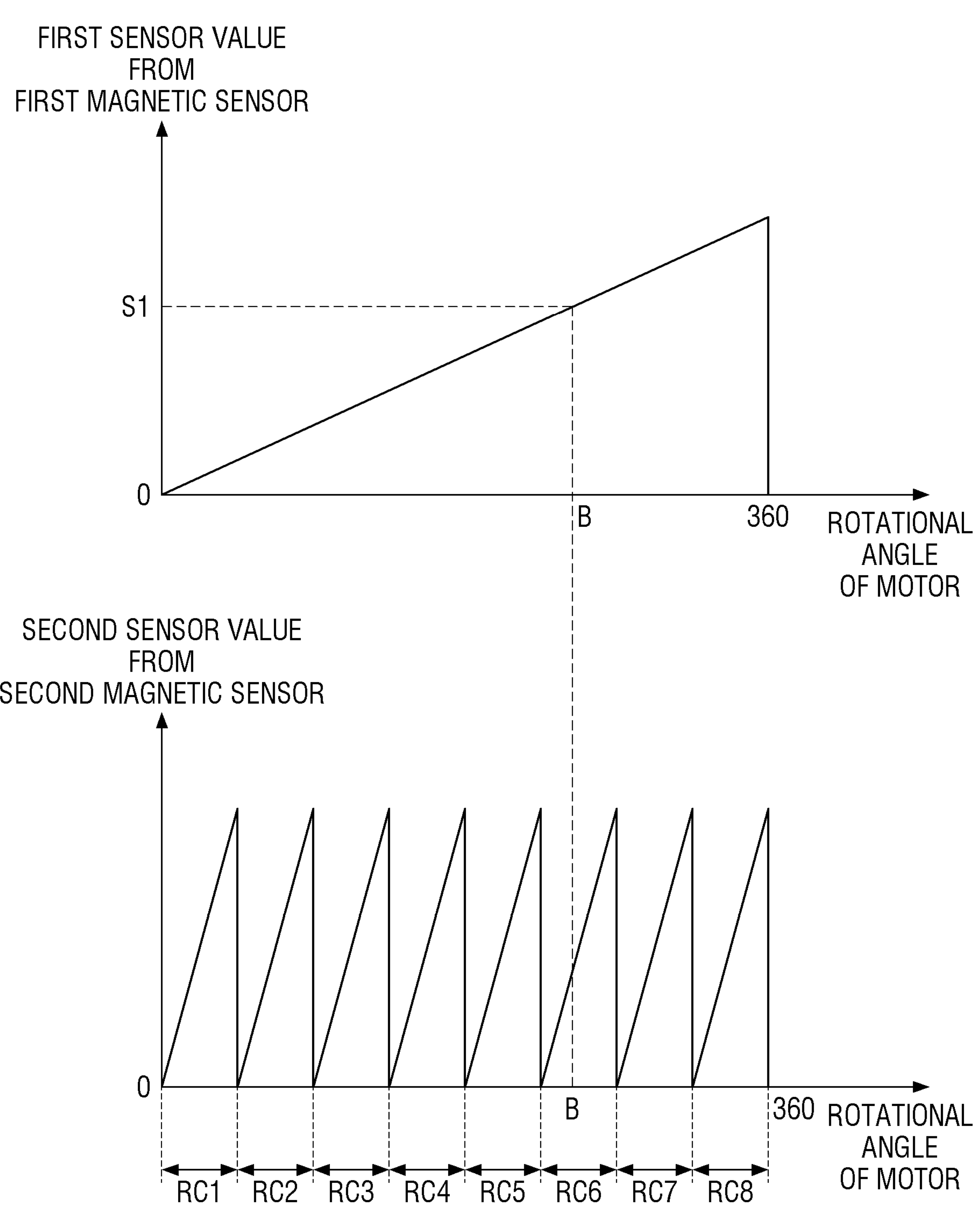
FIG. 17 is a drawing for explaining how to determine the reference angle range based on a first sensor value according to one or more embodiments.
Figure 18:
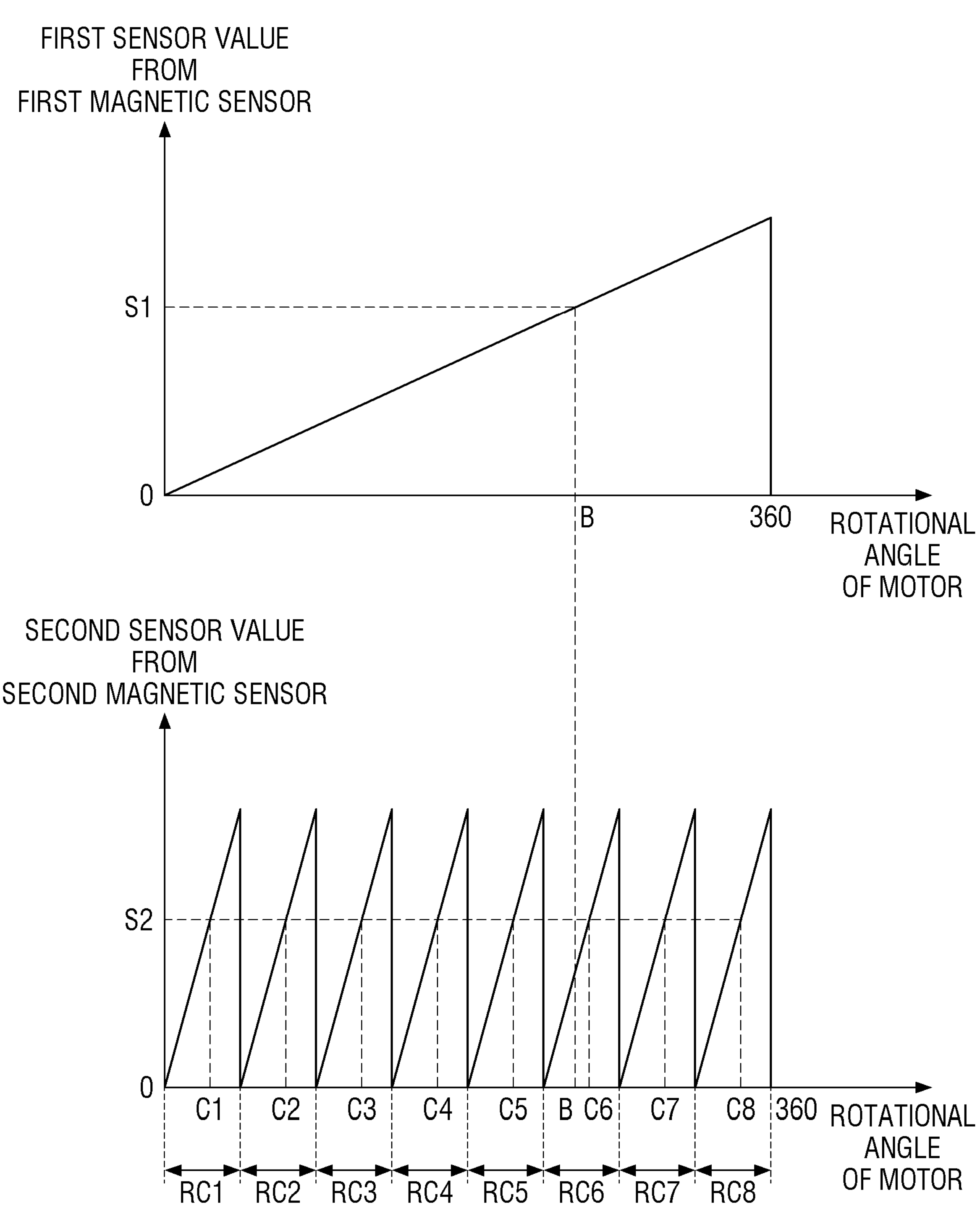
FIG. 18 is a drawing for explaining how to determine the rotation angle of the motor based on a second sensor value calculated for the reference angle range according to one or more embodiments.

FIG. 16 is a drawing illustrating sensing assemblies and targets according one or more embodiments, FIG. 17 is a drawing for explaining how to determine the reference angle range based on a first sensor value according one or more embodiments, and FIG. 18 is a drawing for explaining how to determine the rotation angle of the motor based on a second sensor value calculated for the reference angle range according one or more embodiments.

Referring to FIG. 16, sensing assemblies 510 and 520 according to one or more embodiments may be referred to as first and second sensing assemblies 510 and 520, and targets 610 and 620 may include first and second targets 610 and 620.

The first sensing assembly 510 may generate a first magnetic field and detect changes in the first magnetic field. The second sensing assembly 520 may generate a second magnetic field and detect changes in the second magnetic field. The first target 610 may be rotated by the driving force of the motor 320, may include one first blade 611, and may alter the first magnetic field. The second target 620 may be rotated by the driving force of the motor 320, may include a plurality of second blades, and may alter the second magnetic field.

The first target 610 and the second target 620 may both be coupled to the same shaft 630. The shaft 630 may be coupled to the rotational axis of the motor 320 or may be an extension of the rotational axis of the motor 320. As the shaft 630 rotates, the first and second targets 610 and 620 may rotate simultaneously.

The first sensing assembly 510 may include a first substrate 511, a first coil 512, and a first magnetic field sensor 513. Similarly, the second sensing assembly 520 may include a second substrate 521, a second coil 522, and a second magnetic field sensor 523.

The first coil 512 may be disposed on the first substrate 511 facing the first target 610, and the second coil 522 may be disposed on the second substrate 521 facing the second target 620. The first coil 512 may generate a first magnetic field, and the second coil 522 may generate a second magnetic field. The first magnetic field may be altered by the first blade 611 of the first target 610, and the second magnetic field may be altered by the second blades 621 of the second target 620. The first magnetic field sensor 513 may detect the first magnetic field altered by the first blade 611 and output a first sensor value, and the second magnetic field sensor 523 may detect the magnetic field altered by the second blades 621 and output a second sensor value.

The control device 400 may determine the rotation angle of the motor 320 based on sensing result data from the first sensing assembly 510 and sensing result data from the second sensing assembly 520. Specifically, the control device 400 may determine the rotation angle of the motor 320 based on the first and second sensor values.

Referring to FIG. 17, the reference angle range may be determined based on the first sensor value according one or more embodiments.

The first target 610 may include one first blade 611. according one or more embodiments, the first blade 611 may be provided in the shape of a half-disc. As the first blade 611 rotates around the first coil 512, the rotational cycles of the motor 320 and the cycles of magnetic field changes caused by the first blade 611 may be formed to be identical. according one or more embodiments, one cycle of magnetic field change may be formed when the motor 320 rotates once.

Since the rotational cycles of the motor 320 coincide with the cycles of magnetic field changes, the approximate rotation angle of the motor 320 may be determined by detecting the magnetic field change caused by the first blade 611. Because a particular sensor value from the first magnetic field sensor 513 corresponds to a particular rotation angle of the motor 320, the approximate rotation angle of the motor 320 may be determined based on the sensor value output from the first magnetic field sensor 513 alone. FIG. 17 illustrates that when the first sensor value is S1, the approximate rotation angle of the motor 320 is B.

The second sensor value calculated for each of the second blades 621 may correspond to different partial angle ranges RC1 through RC8 within the rotation angle range of the motor 320. The control device 400 may determine the partial angle range corresponding to the first sensor value from the first magnetic field sensor 513, among the partial angle ranges RC1 through RC8, as the reference angle range. The reference angle range represents the partial angle range used to determine the rotation angle of the motor 320.

As depicted in FIG. 17, if the first sensor value is S1, the approximate rotation angle (B) of the motor 320 may be included in the partial angle range RC6. In this case, the control device 400 may determine the partial angle range RC6, among the partial angle ranges RC1 through RC8, as the reference angle range.

Referring to FIG. 18, the control device 400 may calculate the predicted rotation angles C1 through C8 of the motor 320 that correspond to the second sensor value output by the second magnetic field sensor 523 for the partial angle ranges RC1 through RC8, and may determine the rotation angle of the motor 320 based on the predicted rotation angle calculated for the reference angle range among the partial angle ranges RC1 through RC8.

If the sensor value output by the second magnetic field sensor 523 is S2, the predicted rotation angles C1 through C8 may be calculated for the partial angle ranges RC1 through RC8. The partial angle ranges RC1 through RC8 correspond to the second blades 621. If counting of the second blades 621 is not performed, the control device 400 cannot determine which of the partial angle ranges RC1 through RC8 is the reference angle range. The control device 400 may determine, based on the first sensor value from the first magnetic field sensor 513, that the partial angle range RC6 is the reference angle range, and may determine that the predicted rotation angle C6 is the actual rotation angle of the motor 320 accordingly.

Figure 19:
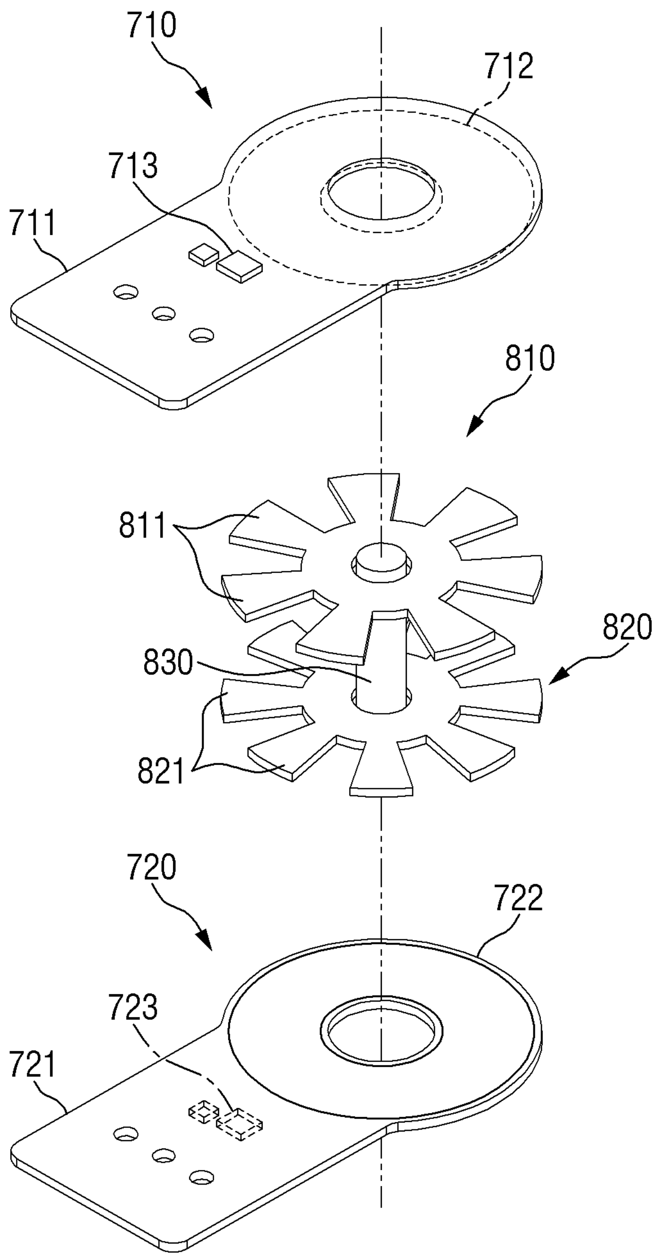
FIG. 19 is a drawing illustrating sensing assemblies and targets according to one or more embodiments.
Figure 20:
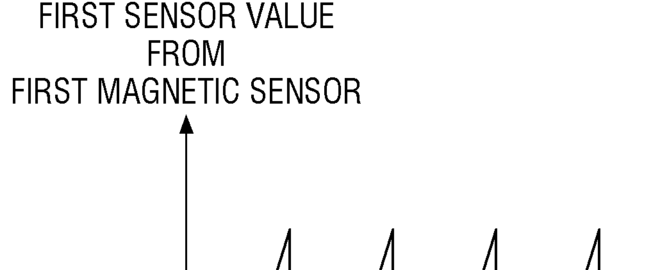
FIG. 20 is a drawing for explaining how the rotation angle of the motor is determined by the combination of the first and second sensor values according to one or more embodiments.
Figure 20:
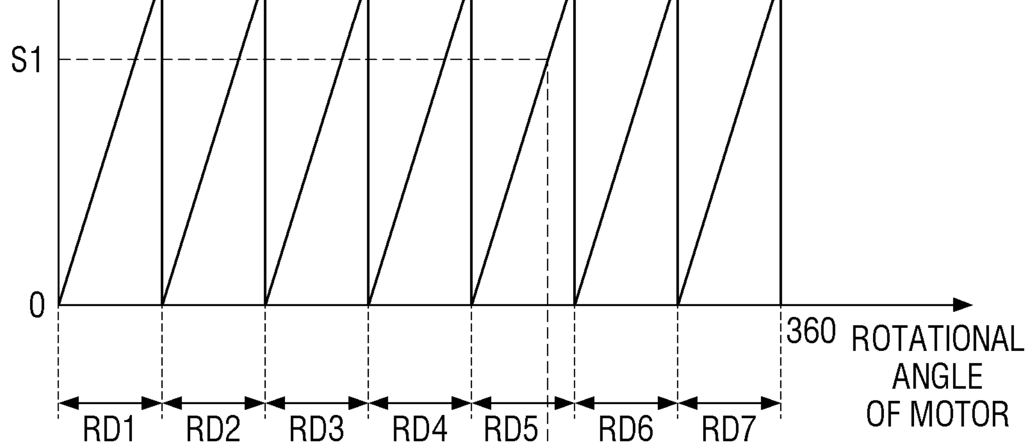
Figure 20:
Figure 20:
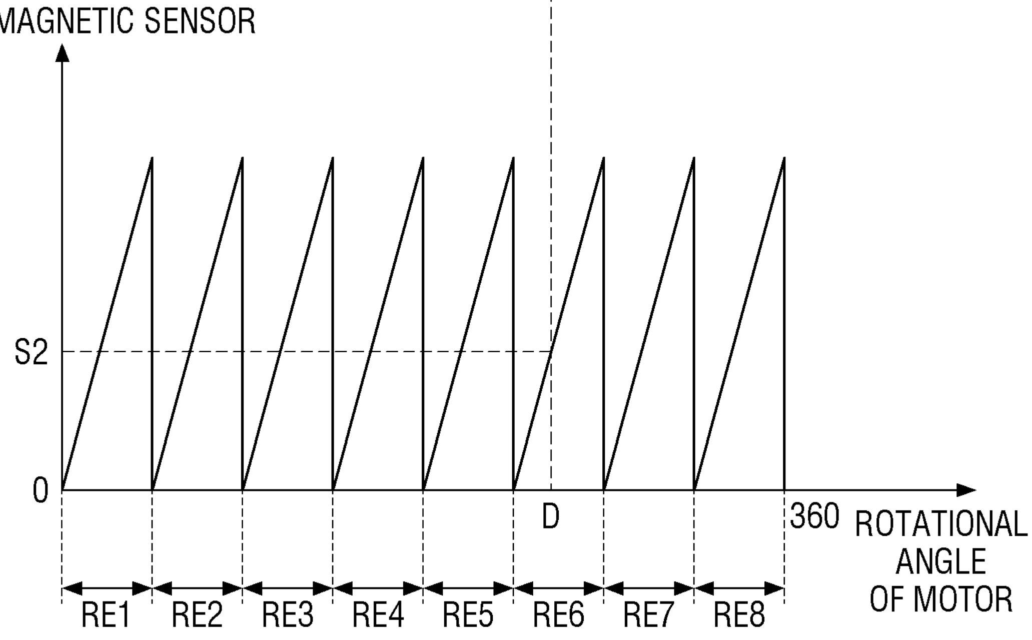

FIG. 19 is a drawing illustrating sensing assemblies and targets according one or more embodiments, and FIG. 20 is a drawing for explaining how the rotation angle of the motor 320 is determined by the combination of the first and second sensor values according one or more embodiments.

Referring to FIG. 19, sensing assemblies 710 and 720 may be referred to as first and second sensing assemblies 710 and 720, and targets 810 and 820 may be referred to as first and second targets 810 and 820.

The first sensing assembly 710 may generate a first magnetic field and detect changes in the first magnetic field. Similarly, the second sensing assembly 720 may generate a second magnetic field and detect changes in the second magnetic field. The first target 810 may be rotated by the driving force of the motor 320, may include a first number of first blades 811 and may alter the first magnetic field. The second target 820 may be rotated by the driving force of the motor 320, may include a second number of second blades, and may alter the second magnetic field.

The difference between the first and second numbers may be one. According one or more embodiments, the first and second numbers may be seven and eight, respectively, but alternatively, in some embodiments of the present invention, the difference between the first and second numbers may exceed one. The difference between the first and second numbers will hereinafter be described as being one.

The first and second targets 810 and 820 may both be coupled to the same shaft 830. The shaft 830 may be coupled to the rotational axis of the motor 320 or may be an extension of the rotational axis of the motor 320. As the shaft 830 rotates, the first and second targets 810 and 820 may rotate simultaneously.

The first sensing assembly 710 may include a first substrate 711, a first coil 712, and a first magnetic field sensor 713. Similarly, the second sensing assembly 720 may include a second substrate 721, a second coil 722, and a second magnetic field sensor 723.

The first coil 712 may be disposed on the first substrate 711 facing the first target 810, and the second coil 722 may be disposed on the second substrate 721 facing the second target 820. The first coil 712 may generate a first magnetic field, and the second coil 722 may generate a second magnetic field. The first magnetic field may be altered by the first blades 811 of the first target 810, and the second magnetic field may be altered by the second blades 821 of the second target 820. The first magnetic field sensor 713 may detect the first magnetic field altered by the first number of first blades 811 and output first sensor values, and the second magnetic field sensor 723 may detect the magnetic field altered by the second number of second blades 821 and output second sensor values.

The control device 400 may determine the rotation angle of the motor 320 based on sensing result data from the first sensing assembly 710 and sensing result data from the second sensing assembly 720. Specifically, the control device 400 may determine the rotation angle of the motor 320 based on the combination of the first and second sensor values.

Referring to FIG. 20, the first sensor value calculated for each of the first number of first blades 811 may correspond to different partial angle ranges RD1 through RD7 within the rotation angle range of the motor 320. Similarly, the second sensor value calculated for each of the second number of second blades 821 may correspond to different partial angle ranges RE1 through RE8 within the rotation angle range of the motor 320. The partial angle ranges RD1 through RD7 corresponding to the cycles of changes in the first sensor value will hereinafter be referred to as first partial angle ranges RD1 through RD7, and the partial angle ranges RE1 through RE8 corresponding to the cycles of changes in the second sensor value will hereinafter be referred to as second partial angle ranges RE1 through RE8.

According one or more embodiments, the difference between the first and second numbers may be one. The second number will hereinafter be described as being one greater than the first number.

The first number may be seven, and the second number may be eight. In this case, as illustrated in FIG. 20, seven first partial angle ranges RD1 through RD7 may be formed, and eight second partial angle ranges RE1 through RE8 may be formed.

When the difference between the first and second numbers is one, the control device 400 may determine the rotation angle of the motor 320 based on the combination of the first and second sensor values. If the first and second sensor values are output, a single rotation angle may be calculated based on the combination of the first and second sensor values. As described with reference to FIG. 20, if the first sensor value is S1 and the second sensor value is S2, a rotation angle D may be calculated.

The rotation angle of the motor 320 may be calculated based on the combination of the first and second sensor values, as indicated by Equation 5:

$$MA = \frac{s1\frac{n}{n-1} + s2}{360/2n}. \quad \text{[Equation 5]}$$

Here, MA represents the actual rotation angle of the motor 320, s1 represents the first sensor value, s2 represents the second sensor value, and n represents the second number.

The control device 400 may store changes in the first sensor value for each of the first partial angle ranges RD1 through RD7, and changes in the second sensor value for each of the second partial angle ranges RE1 through RE8. Consequently, when the first and second sensor values are received from the first and second magnetic field sensors 713 and 723, respectively, the control device 400 may apply the first and second sensor values to the aforementioned equation to calculate the actual rotation angle of the motor 320.

Figure 21:
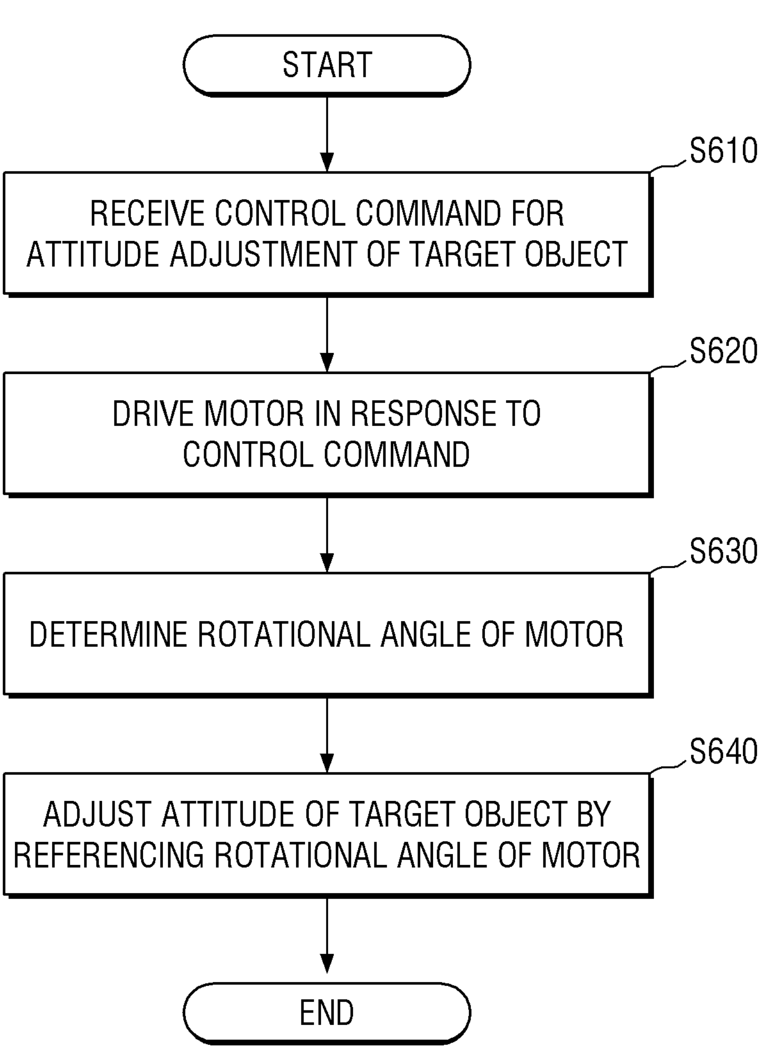
FIG. 21 is a flowchart illustrating an attitude adjustment method according to an embodiment of the present invention.

FIG. 21 is a flowchart illustrating an attitude adjustment method according one or more embodiments.

Referring to FIG. 21, the control device 400 may adjust the attitude of the target object 20 through feedback control.

First, the control device 400 may receive a control command for attitude adjustment of the target object 20 (S610). Upon receiving the control command, the control device 400 may drive the motor 320 provided in the driving device 301 or 302 in response to the control command and may determine the rotation angle of the motor 320 (S620). The rotation angle of the motor 320 may be determined based on a sensor value from the magnetic field sensor 363 (S630).

Furthermore, the control device 400 may adjust the attitude of the target object 20 based on the rotation angle of the motor 320 (S640). The control device 400 performs feedback control of the motor 320 based on sensing result data, i.e., the sensor value from the magnetic field sensor 363, until the rotation angle of the motor 320 is included within a target threshold range.

The control device 400 may determine the rotation angle of the motor 320 based on both the target rotation angle and the sensing result data from the sensing assembly 360. The sensor value calculated for each blade may correspond to different partial angle ranges within the rotation angle range of the motor 320. The control device 400 may determine the partial angle range corresponding to the target rotation angle as the reference angle range. Moreover, the control device 400 may calculate the predicted rotation angle of the motor 320 corresponding to the sensor value output by the magnetic field sensor 363 for each partial angle range and may determine the rotation angle of the motor 320 based on the predicted rotation angle calculated for the reference angle range.

Alternatively, the control device 400 may determine the rotation angle of the motor 320 based on sensing result data from the first sensing assembly 510 and sensing result data from the second sensing assembly 520. According one or more embodiments, if the first target 610 includes a single first blade 611 and the second target 620 includes multiple second blades 621, the control device 400 may determine the partial angle range corresponding to a first sensor value from the first magnetic field sensor 513 as the reference angle range. Furthermore, the control device 400 may calculate the predicted rotation angle of the motor 320 corresponding to a second sensor value output by the second magnetic field sensor 523 for each partial angle range and determine the rotation angle of the motor 320 based on the predicted rotation angle calculated for the reference angle range.

Meanwhile, if the first target 810 includes the first number of first blades 811, and the second target 820 includes the second number of second blades, and the difference between the first and second numbers is one, the control device 400 may determine the rotation angle of the motor 320 by referring to the combination of the first and second sensor values. In this case, the control device 400 may determine the rotation angle of the motor 320 by referring to Equation 5.

At least one of the components, elements, modules, units, or the like (collectively "components" in this paragraph) represented by a block in the above-described embodiments and drawings including the controller 430 and the sensor value receiver (FIG. 3), not being limited thereto, may be physically implemented by analog and/or digital circuits including one or more of a logic gate, an integrated circuit, a microprocessor, a microcontroller, a memory circuit, a passive electronic component, an active electronic component, and the like, and may be driven by software and/or firmware implemented by computer instruction codes stored in one or more internal or external memories including those in the storage 420 (FIG. 3) to perform the functions or operations described herein.

While the disclosure has been illustrated and described with reference to one or more embodiments, it will be understood that the one or more embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiments described herein may be used in conjunction with any other embodiments described herein.

What is claimed is:

1. An attitude adjustment apparatus comprising:

a driving device comprising a motor configured to generate a driving force; and a control device comprising at least one processor configured to adjust an attitude of a target object based on a rotation angle of the motor, wherein the driving device further comprises:

a sensing assembly configured to generate a magnetic field, sense changes in the magnetic field, and output sensing result data based on the changes in the magnetic field; and a target, which is rotated by the driving force of the motor, comprising a plurality of blades configured to alter the magnetic field generated by the sensing assembly, and wherein the control device is further configured to determine the rotation angle of the motor based on a target rotation angle and the sensing result data, and wherein the sensing assembly further comprises a coil configured to generate the magnetic field, and a magnetic field sensor configured to sense the magnetic field altered by the plurality of blades and sequentially output a sensor value calculated for each of the plurality of blades.

2. The attitude adjustment apparatus of claim 1, wherein the at least one processor is further configured to receive the target rotation angle of the motor, set a current angle of the motor as an initial angle, and control the motor to rotate by the target rotation angle from the initial angle.

3. The attitude adjustment apparatus of claim 1, wherein the sensor value calculated for each of the plurality of blades corresponds to different partial angle ranges within a rotation angle range of the motor, and wherein the control device is further configured to determine a partial angle range that corresponds to the target rotation angle, among the partial angle ranges, as a reference angle range for determining the rotation angle of the motor.

4. The attitude adjustment apparatus of claim 3, wherein the at least one processor is further configured to calculate a predicted rotation angle of the motor that corresponds to the sensor value output by the magnetic field sensor for each of the partial angle ranges, and determine the predicted rotation angle calculated for the reference angle range, among the partial angle ranges, as the rotation angle of the motor.

5. An attitude adjustment apparatus comprising:

a driving device comprising a motor configured to generate a driving force; and a control device comprising at least one processor configured to adjust an attitude of a target object based on a rotation angle of the motor, wherein the driving device further comprises:

a first sensing assembly configured to generate a first magnetic field, sense changes in the first magnetic field, and output, to the at least one processor, first sensing result data based on the changes in the first magnetic field;

a second sensing assembly configured to generate a second magnetic field, sense changes in the second magnetic field, and output, to the at least one processor, second sensing result data based on the changes in the second magnetic field;

a first target, which is rotated by the driving force of the motor, comprising a single first blade configured to alter the first magnetic field; and a second target, which is rotated by the driving force of the motor, comprising a plurality of second blades configured to alter the second magnetic field, and wherein the at least one processor is further configured to determine the rotation angle of the motor based on a target rotation angle, the first sensing result data, and sensing second result data.

6. The attitude adjustment apparatus of claim 5, wherein the at least one processor is further configured to receive the target rotation angle of the motor, set a current angle of the motor as an initial angle, and control the motor to rotate by the target rotation angle from the initial angle.

7. The attitude adjustment apparatus of claim 5, wherein the first sensing assembly comprises a first coil configured to generate the first magnetic field, and a first magnetic sensor configured to sense the first magnetic field altered by the first blade and output a first sensor value calculated for the first blade, and wherein the second sensing assembly comprises a second coil configured to generate the second magnetic field, and a second magnetic field sensor comprising configured to sense the second magnetic field altered by the plurality of second blades and output a second sensor value calculated for each of the plurality of second blades.

8. The attitude adjustment apparatus of claim 7, wherein the second sensor value calculated for each of the plurality of second blades corresponds to different partial angle ranges within a rotation angle range of the motor, and wherein the at least one processor is further configured to determine a partial angle range that corresponds to the first sensor value from the first magnetic sensor, among the partial angle ranges, as a reference angle range for determining the rotation angle of the motor.

9. The attitude adjustment apparatus of claim 8, wherein the at least one processor is further configured to calculate a predicted rotation angle of the motor that corresponds to the second sensor value output by the second magnetic field sensor for each of the partial angle ranges, and determine the predicted rotation angle calculated for the reference angle range, among the partial angle ranges, as the rotation angle of the motor.

10. An attitude adjustment apparatus comprising:

a driving device comprising a motor configured to generate a driving force; and a control device comprising at least one processor configured to adjust an attitude of a target object based on a rotation angle of the motor, wherein the driving device further comprises:

a first sensing assembly configured to generate a first magnetic field, sense changes in the first magnetic field, and output, to the at least one processor, first sensing result data based on the changes in the first magnetic field;

a second sensing assembly configured to generate a second magnetic field, sense changes in the second magnetic field, and output, to the at least one processor, second sensing result data based on the changes in the second magnetic field;

a first target, which is rotated by the driving force of the motor, comprising a plurality of first blades configured to alter the first magnetic field; and a second target, which is rotated by the driving force of the motor, comprising a plurality of second blades configured to alter the second magnetic field, and wherein the at least one processor is further configured to determine the rotation angle of the motor based on a target rotation angle, the first sensing result data, and the second sensing result data.

11. The attitude adjustment apparatus of claim 10, wherein a difference between a number of blades in the plurality of first blades and a number of blades in the plurality of second blades is one.

12. The attitude adjustment apparatus of claim 10, wherein the first sensing assembly comprises a first coil configured to generate the first magnetic field, and a first magnetic sensor configured to sense the first magnetic field altered by the plurality of first blades and output a first sensor value calculated for each of the plurality of first blades, wherein the second sensing assembly comprises a second coil configured to generate the second magnetic field, and a second magnetic sensor configured to sense the second magnetic field altered by the plurality of second blades and output a second sensor value calculated for each of the plurality of second blades, and wherein the at least one processor is further configured to determine the rotation angle of the motor based on a combination of the first and second sensor values.

13. The attitude adjustment apparatus of claim 10, wherein the at least one processor is further configured to receive the target rotation angle of the motor, set a current angle of the motor as an initial angle, and control the motor to rotate by the target rotation angle from the initial angle.

* * * * *